US012620363B2

(12) United States Patent
Kim et al.

(10) Patent No.: US 12,620,363 B2
(45) Date of Patent: May 5, 2026

(54) DRIVING CIRCUIT

(71) Applicant: Samsung Display Co., Ltd., Yongin-si (KR)

(72) Inventors: Kyunghoon Kim, Yongin-si (KR); Kyonghwan Oh, Yongin-si (KR); Joondong Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 19/027,688

(22) Filed: Jan. 17, 2025

(65) Prior Publication Data

US 2025/0292737 A1     Sep. 18, 2025

(30) Foreign Application Priority Data

Mar. 13, 2024     (KR) ........................ 10-2024-0035430

(51) Int. Cl.
*G09G 3/3266*     (2016.01)
*G11C 19/28*     (2006.01)
*H10D 30/67*     (2025.01)

(52) U.S. Cl.
CPC ......... *G09G 3/3266* (2013.01); *G11C 19/287* (2013.01); *G09G 2300/0819* (2013.01); *G09G 2310/0243* (2013.01); *G09G 2310/0264* (2013.01); *G09G 2310/0267* (2013.01); *G09G 2310/0286* (2013.01); *G09G 2320/045* (2013.01); *G09G 2330/021* (2013.01); *H10D 30/67* (2025.01)

(58) Field of Classification Search
CPC ......... G09G 3/3266; G09G 2310/0286; G09G 2310/0243; G09G 2310/0267; G09G 2330/021; G09G 2300/0819; G09G 2310/0264; G09G 2320/045; G11C 19/287; H10D 30/67
See application file for complete search history.

(56) References Cited

U.S. PATENT DOCUMENTS

| | | | |
|---|---|---|---|
| 9,305,509 | B2 | 4/2016 | Li et al. |
| 9,324,270 | B2 | 4/2016 | Jeong |
| 10,522,609 | B2 | 12/2019 | Woo et al. |
| 10,909,929 | B2 | 2/2021 | Yang et al. |
| | | (Continued) | |

FOREIGN PATENT DOCUMENTS

| | | |
|---|---|---|
| KR | 102305984 B1 | 9/2021 |
| KR | 1020220037660 A | 3/2022 |
| | (Continued) | |

*Primary Examiner* — Douglas Wilson
(74) *Attorney, Agent, or Firm* — CANTOR COLBURN LLP

(57)     ABSTRACT

A gate driving circuit includes stages, where each stage of the gate driving circuit includes a second transistor connected between a first node and a second node and which includes a first gate connected to a second terminal through which a first voltage is supplied and a second gate connected to a third terminal through which a second voltage is supplied, a fourth transistor connected between the second terminal and an output terminal and which includes a first gate connected to the second node and a second gate connected to the third node, a first capacitor connected between the second node and the output terminal and a second capacitor connected between the third node and the output terminal.

20 Claims, 22 Drawing Sheets

(56) References Cited

U.S. PATENT DOCUMENTS

| | | | | |
|---|---|---|---|---|
| 10,937,371 | B2 | 3/2021 | Chung et al. | |
| 11,328,642 | B2 | 5/2022 | Shang et al. | |
| 2016/0225307 | A1* | 8/2016 | Yoon .................... | G09G 3/2092 |
| 2019/0304374 | A1* | 10/2019 | Wang ................... | G09G 3/3266 |
| 2022/0093028 | A1 | 3/2022 | Hong et al. | |
| 2022/0101775 | A1 | 3/2022 | Na et al. | |
| 2023/0097004 | A1* | 3/2023 | Yu ........................ | G09G 3/3291 |
| | | | | 345/204 |
| 2024/0386838 | A1 | 11/2024 | Oh et al. | |
| 2025/0349265 | A1* | 11/2025 | Bong .................. | G09G 3/3233 |

FOREIGN PATENT DOCUMENTS

| | | | | | |
|---|---|---|---|---|---|
| KR | 1020220042031 | A | | 4/2022 | |
| KR | 102393141 | B1 | | 5/2022 | |
| KR | 20240107460 | A | * | 7/2024 | ........... H10K 77/111 |
| KR | 1020240166065 | A | | 11/2024 | |

\* cited by examiner

Q
= VGL+|Vth|

V1 —||  T2  |— V2

A
= VGL+|Vth|

DRIVING CIRCUIT

This application claims priority to Korean Patent Application No. 10-2024-0035430, filed on Mar. 13, 2024, and all the benefits accruing therefrom under 35 U.S.C. § 119, the content of which in its entirety is herein incorporated by reference.

BACKGROUND

1. Field

The invention relates to a display apparatus, and more particularly, to a driving circuit configured to output a gate signal and a display apparatus including the driving circuit.

2. Description of the Related Art

A display apparatus includes a pixel area, a gate driving circuit, a data driving circuit, a controller, and the like, where the pixel area includes a plurality of pixels. The gate driving circuit includes stages connected to gate lines, and the stages respectively supply gate signals to the gate lines connected thereto.

SUMMARY

One or more embodiments include a driving circuit that is capable of stably outputting a gate signal at low power and a display apparatus that includes the driving circuit.

According to one or more embodiments, a driving circuit includes a plurality of stages, wherein each of the plurality of stages includes a first transistor connected between a first node and a first terminal through which a start signal is input and which includes a gate connected to a clock terminal through which a clock signal is input, a second transistor connected between the first node and a second node and including a first gate connected to a second terminal through which a first voltage is supplied and a second gate connected to a third terminal through which a second voltage is supplied, a third transistor connected between the first node and a third node and including a gate connected to the third terminal, a fourth transistor connected between the second terminal and an output terminal and including a first gate connected to the second node and a second gate connected to the third node, a fifth transistor connected between the third terminal and the output terminal and including a gate connected to the third node, a first capacitor connected between the second node and the output terminal, and a second capacitor connected between the third node and the output terminal, wherein the first voltage is a high-level voltage and the second voltage is a low-level voltage.

In an embodiment, the driving circuit may further include a sixth transistor connected between the first node and the third terminal and including a gate connected to a fourth terminal configured to supply a reset signal, and a third capacitor connected between the first node and the second terminal.

In an embodiment, the first transistor, the third transistor, and the fifth transistor may be P-type transistors, and the second transistor and the fourth transistor may be N-type transistors.

In an embodiment, the start signal may include an external signal or an output signal which is output by a previous stage.

In an embodiment, the driving circuit may further include a seventh transistor connected between the output terminal and the fifth transistor and including a gate connected to the third node.

In an embodiment, the clock signal may alternate between a first voltage level and a second voltage level, where the first voltage level may be a high-level voltage level and the second voltage level may be a low-level voltage level.

In an embodiment, a clock signal input to a clock terminal of even-numbered stages among the plurality of stages may be shifted by a half cycle from a clock signal input to a clock terminal of odd-numbered stages.

In an embodiment, in a first section in which the start signal of the first voltage level is input and the clock signal of the second voltage level is input, a voltage of the first node and the third node may be at the first voltage level and a voltage of the second node may be at a third voltage level which is higher than the first voltage level, and an output signal of the first voltage level may be output from the output terminal by the turned-on fourth transistor.

In an embodiment, in a second section which follows the first section and in which the start signal of the first voltage level is input and in which the clock signal of the first voltage level is input, a voltage of the first node and the third node may be at the first voltage level and a voltage of the second node may be at the third voltage level, and an output signal of the first voltage level may be output from the output terminal by the turned-on fourth transistor.

In an embodiment, in a third section which follows the second section and in which the start signal of the second voltage level is input and in which the clock signal of the first voltage level is input, a voltage of the first node and the second node may be at the first voltage level and a voltage of the third node may be at the third voltage level, and an output signal of the first voltage level may be output from the output terminal by the turned-on fourth transistor.

In an embodiment, in a fourth section which follows the third section and in which the start signal of the second voltage level is input and in which the clock signal of the second voltage level is input, a voltage of the first node and the second node may be at the second voltage level and a voltage of the third node may be at a fourth voltage level which is lower than the second voltage level, and an output signal of the second voltage level may be output from the output terminal by the turned-on fifth transistor.

In an embodiment, in a fifth section which follows the fourth section and in which the start signal of the second voltage level is input and in which the clock signal of the first voltage level is input, a voltage of the first node and the second node may be at the second voltage level and a voltage of the third node may be at the fourth voltage level, and an output signal of the second voltage level may be output from the output terminal by the turned-on fifth transistor.

In an embodiment, the driving circuit may further include a sixth transistor connected between the second node and the third terminal and including a gate connected to the third node.

According to one or more embodiments, a driving circuit includes a plurality of stages, wherein each of the plurality of stages includes a first transistor connected between a first node and a first terminal through which a start signal is input and which includes a gate connected to a clock terminal through which a clock signal is input, a second transistor connected between the first node and a second node and which includes a first gate connected to a second terminal through which a first voltage is supplied and a second gate connected to a third terminal through which a second voltage is supplied, a third transistor connected between the first node and a third node and which includes a gate connected to a fourth terminal through which a third voltage is supplied, a fourth transistor connected between the second terminal and an output terminal and which includes a first gate connected to the second node and a second gate connected to a fifth terminal through which a fourth voltage is supplied, a fifth transistor connected between the fourth terminal and the output terminal and which includes a gate connected to the third node, a first capacitor connected between the second node and the output terminal, and a second capacitor connected between the third node and the output terminal, wherein the first voltage is a high-level voltage and the third voltage is a low-level voltage.

In an embodiment, the driving circuit may further include a sixth transistor connected between the first node and the fourth terminal and which includes a gate connected to a sixth terminal configured to supply a reset signal, and a third capacitor connected between the first node and the second terminal.

In an embodiment, the driving circuit may further include a seventh transistor connected between the third transistor and the third node and which includes a gate connected to the fourth terminal, and an eighth transistor connected between a fourth node between the third transistor and the seventh transistor and a seventh terminal through which a fifth voltage is supplied and which includes a gate connected to the third node, wherein the fifth voltage may be lower than the third voltage.

In an embodiment, the first transistor, the third transistor, the fifth transistor, the seventh transistor, and the eighth transistor may be P-type transistors, and the second transistor and the fourth transistor may be N-type transistors.

In an embodiment, the second voltage may be equal to the first voltage.

In an embodiment, the third terminal may be connected to the first node.

In an embodiment, the fourth voltage may be a negative constant voltage having a greater absolute value than the third voltage.

BRIEF DESCRIPTION OF THE DRAWINGS

The above and other aspects, features, and advantages of certain embodiments of the invention will be more apparent from the following description taken in conjunction with the accompanying drawings, in which:

Figure 7A:
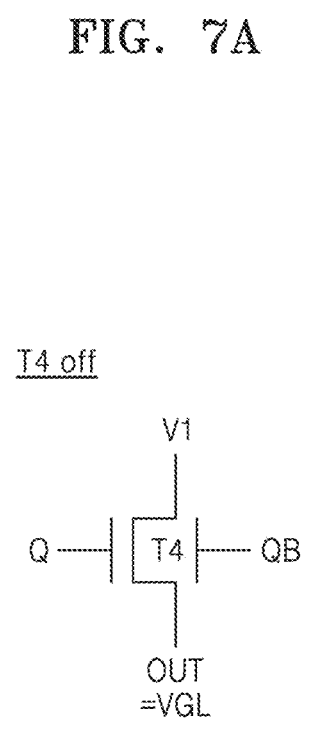

FIG. 7A is a diagram for describing a signal input to a terminal connected to a transistor included in a stage, according to an embodiment;

FIG. 8A is a diagram for describing a signal input to a terminal connected to a transistor included in a stage, according to an embodiment;

DETAILED DESCRIPTION

Figure 1:
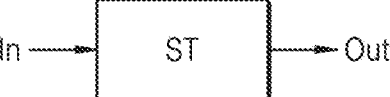
FIG. 1 is a diagram schematically illustrating a stage constituting a driving circuit, according to an embodiment.

Reference will now be made in detail to embodiments, examples of which are illustrated in the accompanying drawings, wherein like reference numerals refer to like elements throughout. In this regard, the invention may have different forms and should not be construed as being limited to the descriptions set forth herein. Accordingly, the embodiments are merely described below, by referring to the figures, to explain aspects of the invention. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The invention may include various embodiments and modifications, and particular embodiments thereof are illustrated in the drawings and will be described herein in detail. The effects and features of the invention and the accomplishing methods thereof will become apparent from the embodiments described below in detail with reference to the accompanying drawings. However, the invention is not limited to the embodiments described below, and may be embodied in various modes.

It will be understood that although terms such as "first" and "second" may be used herein to describe various elements, these elements should not be limited by these terms and these terms are only used to distinguish one element from another element.

As used herein, the singular forms "a," "an," and "the" are intended to include the plural forms as well, unless the context clearly indicates otherwise.

Also, it will be understood that the terms "comprise," "include," and "have" used herein specify the presence of stated features or elements, but do not preclude the presence or addition of one or more other features or elements.

It will be understood that when a layer, region, area, component, or element is referred to as being "on" another layer, region, area, component, or element, it may be "directly on" the other layer, region, area, component, or element or may be "indirectly on" the other layer, region, area, component, or element with one or more intervening layers, regions, areas, components, or elements therebetween.

Moreover, sizes of elements in the drawings may be exaggerated for convenience of description. In other words, because the sizes and thicknesses of elements in the drawings are arbitrarily illustrated for convenience of description, the invention is not limited thereto.

As used herein, "A and/or B" represents the case of A, B, or A and B. Also, "at least one of A and B" represents the case of A, B, or A and B.

In the following embodiments, when X and Y are connected to each other, X and Y may be electrically connected to each other, X and Y may be functionally connected to each other, or X and Y may be physically connected to each other. Also, when X and Y are connected to each other, X and Y may be directly connected to each other or X and Y may be indirectly connected to each other with one or more other elements disposed therebetween. Here, X and Y may be elements (e.g., apparatuses, devices, circuits, lines, electrodes, terminals, films, layers, or areas).

For example, when X and Y are electrically connected to each other, X and Y may be electrically connected to each other directly, or X and Y may be electrically connected to each other indirectly with one or more other elements therebetween. When X and Y are electrically connected to each other indirectly, one or more devices (e.g., switches, transistors, capacitors, inductors, resistors, or diodes) enabling the electrical connection between X and Y may be connected between X and Y. Thus, the invention is not limited to a certain connection relationship, for example, a connection relationship indicated in the drawings or the detailed description, and may also include anything other than the connection relationship indicated in the drawings or the detailed description.

In the following embodiments, "ON" used in connection with a device state may refer to an activated state of the device, and "OFF" may refer to a deactivated state of the device. "ON" used in connection with a signal received by a device may refer to a signal activating the device, and "OFF" may refer to a signal deactivating the device. The device may be activated by a high-level voltage or a low-level voltage. For example, a P-type transistor (P-channel transistor) may be activated by a low-level voltage, and an N-type transistor (N-channel transistor) may be activated by a high-level voltage. Thus, it should be understood that "ON" voltages for the P-type transistor and the N-type transistor have opposite (low versus high) voltage levels. Hereinafter, a voltage activating (turning on) a transistor will be referred to as a gate-on voltage, and a voltage deactivating (turning off) the transistor will be referred to as a gate-off voltage.

Figure 2:
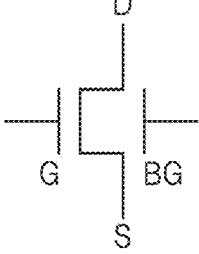
FIG. 2 is a diagram schematically illustrating a transistor included in a stage, according to an embodiment.

FIG. 1 is a diagram schematically illustrating a stage constituting a driving circuit, according to an embodiment. FIG. 2 is a diagram schematically illustrating a transistor included in a stage, according to an embodiment.

In an embodiment and referring to FIG. 1 and FIG. 2, the driving circuit may include a plurality of stages ST, where each stage ST may receive at least one input signal In and generate at least one output signal Out. The at least one input signal In may include a start signal, at least one clock signal, and at least one voltage signal.

Each stage ST may include a plurality of transistors, where some of the plurality of transistors may be P-type transistors, and some others may be N-type transistors.

Each of the P-type transistors and the N-type transistors may be a three-terminal device including a gate G, a source S, and a drain D. In an embodiment, each of the P-type transistors and the N-type transistors may be a four-terminal device including a gate G, a source S, a drain D, and a back gate BG.

The P-type transistor may be a silicon transistor, where the silicon transistor may include a silicon semiconductor, and the silicon semiconductor may include amorphous silicon, polysilicon, or the like. For example, the silicon transistor may be a low-temperature polycrystalline silicon (LTPS) thin film transistor.

The N-type transistor may be an oxide transistor, where the oxide transistor may include an oxide semiconductor, and the oxide semiconductor may include a Zn oxide-based material such as Zn oxide, In—Zn oxide, or Ga—In—Zn oxide. In some embodiments, the oxide semiconductor may be an In—Ga—Zn—O (IGZO) semiconductor. In some embodiments, the oxide semiconductor may be an In—Sn—Ga—Zn—O (ITGZO) semiconductor. For example, the oxide transistor may be a low-temperature polycrystalline oxide (LTPO) thin film transistor.

As for a 4-terminal N-type oxide transistor, when a (−) voltage is applied to a back gate thereof, a threshold voltage thereof may increase and thus may be positively shifted (a positive shift), and when a (+) voltage is applied thereto, the threshold voltage may decrease and thus may be negatively shifted (a negative shift).

A threshold voltage of an oxide transistor may decrease due to a process dispersion, and thus, the oxide transistor may not be turned off. In order to adjust a threshold voltage of the oxide transistor, a (−) voltage may be applied to a back gate thereof to positively shift the threshold voltage. However, an operation speed of the oxide transistor may decrease and thus a turn-on current thereof may decrease. When a (+) voltage is applied to the back gate of the oxide transistor, a decrease in the operation speed thereof and a decrease in the turn-on current thereof may be minimized but the threshold voltage thereof may be negatively shifted.

Figure 3:
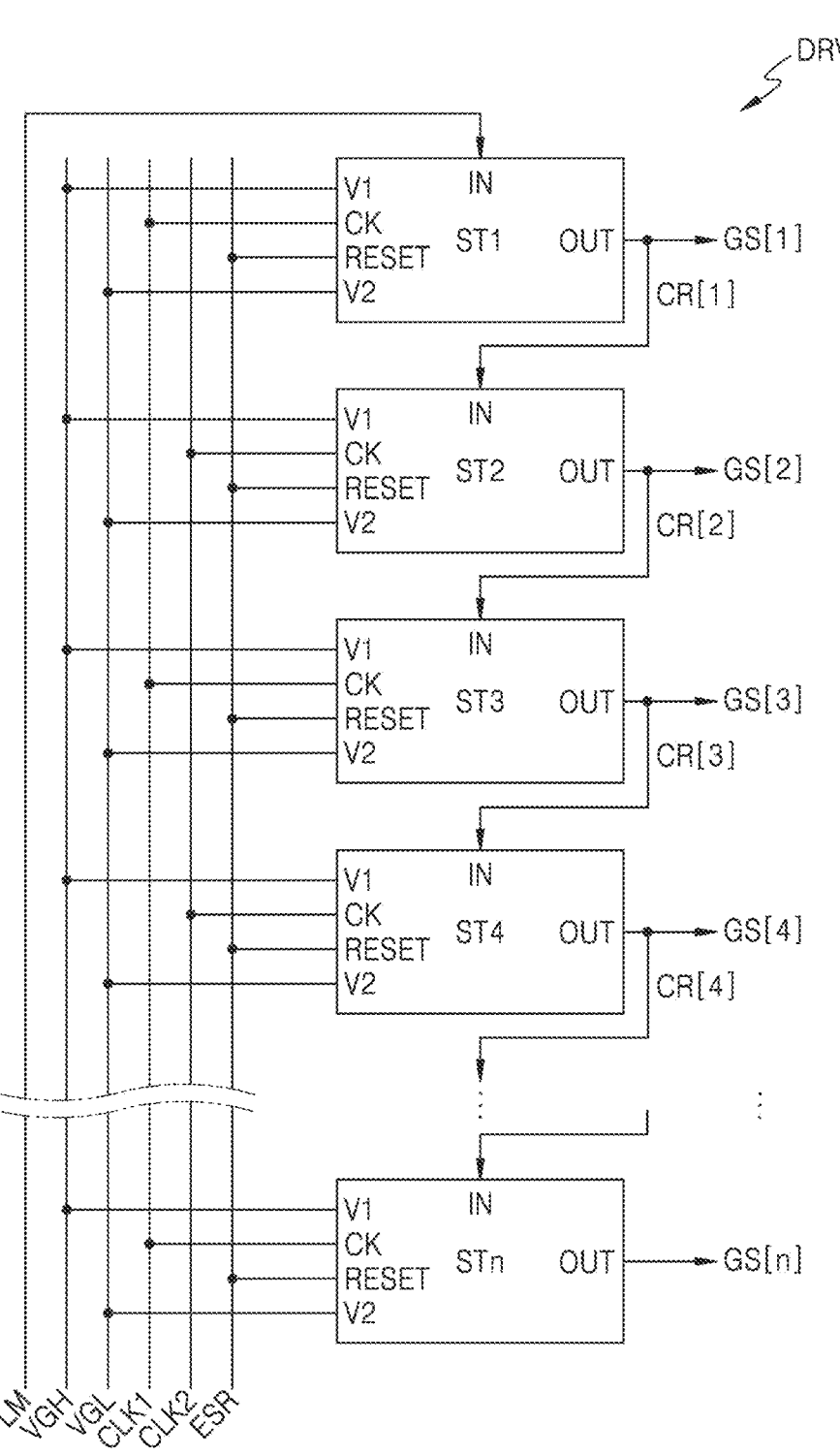
FIG. 3 is a diagram schematically illustrating a driving circuit, according to an embodiment.
Figure 4:
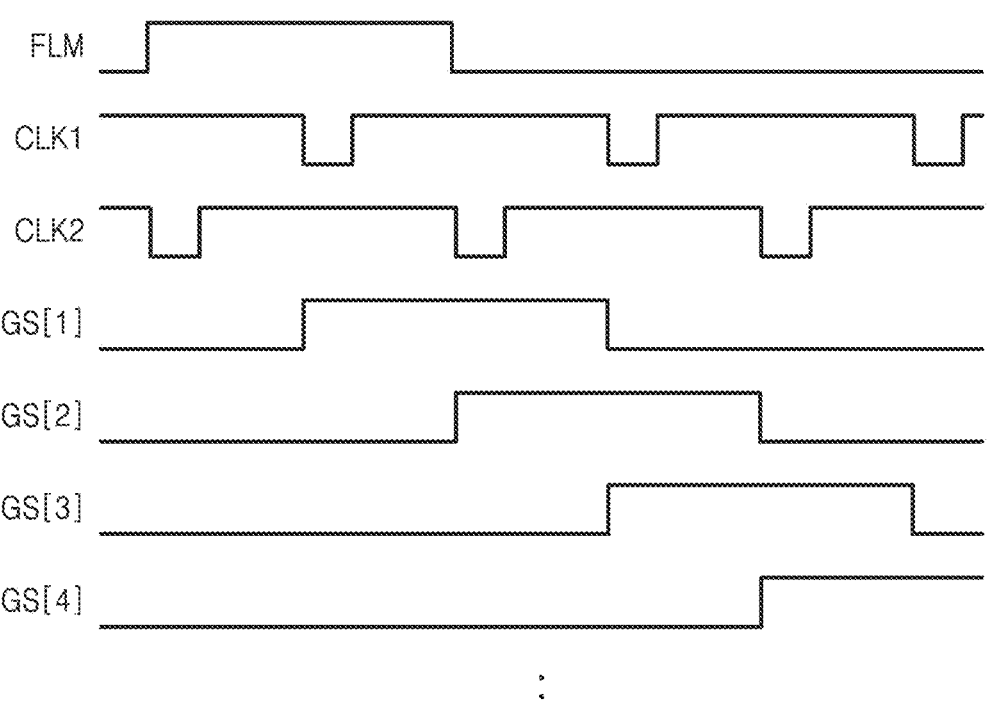
FIG. 4 is a timing diagram schematically illustrating input/output signals of a driving circuit, according to an embodiment.

FIG. 3 is a diagram schematically illustrating a driving circuit, according to an embodiment. FIG. 4 is a diagram schematically illustrating input/output signals of a driving circuit, according to an embodiment.

In an embodiment and referring to FIG. 3, a driving circuit DRV may include a plurality of stages ST1 to STn, where the plurality of stages ST1 to STn may sequentially output and output signals GS[1], GS[2], GS[3], GS[4], . . . , GS[n] to signal lines.

Each of the stages ST1 to STn may include a plurality of terminals through which a plurality of signals are input. The plurality of signals may include a start signal, clock signals CLK1 and CLK2, voltage signals VGH and VGL, and a reset signal ESR. The plurality of terminals may include an input terminal IN, a first voltage input terminal V1, a second voltage input terminal V2, a clock terminal CK, and an output terminal OUT.

A start signal may be input (supplied) to the input terminal IN. The plurality of stages ST1 to STn may respectively output the output signals GS[1], GS[2], GS[3], GS[4], . . . , GS[n] in response to the start signal to the signal lines and the input terminals IN of the corresponding next stages as carry signals CR[1], CR[2], CR[3], CR[4], . . . . The start signal may be an external signal FLM or an output signal which is output by a previous stage (hereinafter referred to as a previous output signal). The external signal FLM may be input as a start signal to the input terminal IN of the first stage ST1, and an output signal (a previous carry signal) output by a previous stage may be input as a start signal to the input terminal IN of each of the second to nth stages ST2 to STn. The previous stage may be a stage which located at least one stage before a current stage. FIG. 3 illustrates an embodiment in which the previous stage is a stage located immediately before the current stage. For example, an output signal GS[3] output from the third stage ST3 may be input as a start signal to the input terminal IN of the fourth stage ST4.

A first voltage VGH may be input to the first voltage input terminal V1, and a second voltage VGL may be input to the second voltage input terminal V2, where the second voltage VGL may be lower than the first voltage VGH. Hereinafter, the first voltage VGH may be referred to as a high-level voltage, and the second voltage VGL may be referred to as a low-level voltage.

A first clock signal CLK1 or a second clock signal CLK2 may be input to the clock terminal CK. In an embodiment, the first clock signal CLK1 may be input to the clock terminal CK of each of the odd-numbered stages ST1, ST3, . . . , and the second clock signal CLK2 may be input to the clock terminal CK of each of the even-numbered stages ST2, ST4, . . . . In an embodiment, the second clock signal CLK2 may be input to the clock terminal CK of each of the odd-numbered stages ST1, ST3, . . . , and the first clock signal CLK1 may be input to the clock terminal CK of each of the even-numbered stages ST2, ST4, . . . . In an embodiment, the second clock signal CLK2 input to the clock terminal CK of each of the even-numbered stages ST2, ST4, . . . may be shifted by a half cycle from the first clock signal CLK1 input to the clock terminal CK of each of the odd-numbered stages ST1, ST3, . . . .

In an embodiment and as illustrated in FIG. 4, the first clock signal CLK1 and the second clock signal CLK2 may be square wave signals that alternate between a high-level voltage and a low-level voltage. In an embodiment, the first clock signal CLK1 and the second clock signal CLK2 may be square wave signals that alternate between the first voltage VGH and the second voltage VGL. In an embodiment, as for the first clock signal CLK1 and the second clock signal CLK2, a duration in which the high-level voltage is maintained for one period may be longer than a duration in which the low-level voltage is maintained for one period.

In an embodiment, the odd-numbered stages ST1, ST3, . . . may output an output signal from the output terminal OUT in synchronization with the first clock signal CLK1 being input to the clock terminal CK. As illustrated in FIG. 4, the output signals GS[1], GS[3], . . . which are output from the output terminals OUT of the odd-numbered stages ST1, ST3, . . . may be sequentially shifted by a certain interval. In an embodiment, the odd-numbered stages ST1, ST3, . . . may sequentially output the output signals GS[1], GS[3], . . . of the high-level voltage by shifting the same by the period of the first clock signal CLK1.

The even-numbered stages ST2, ST4, . . . may output an output signal from the output terminal OUT in synchronization with the second clock signal CLK2 being input to the clock terminal CK. As illustrated in FIG. 4, the output signals GS[2], GS[4], . . . which are output from the output terminals OUT of the even-numbered stages ST2, ST4, . . . may be sequentially shifted by a certain interval. In an embodiment, the even-numbered stages ST2, ST4, . . . may sequentially output the output signals GS[2], GS[4], . . . of the high-level voltage by shifting the same by the period of the second clock signal CLK2.

In an embodiment and again referring to FIG. 3, a reset signal ESR may be input to a reset terminal RESET. A reset signal ESR of a gate-on voltage may be input to a gate of a corresponding transistor at a certain timing, and a reset signal ESR of a gate-off voltage may be input thereto at the other timings. For example, when power is input to a display apparatus (power on), the reset signal ESR may be input as a gate-on voltage to the stages ST1 to STn for a certain time and may be input as a gate-off voltage to the stages ST1 to STn after a lapse of the certain time. The reset signal ESR may be input as a gate-off voltage while the stages ST1 to STn operate to generate an output signal.

Figure 5:
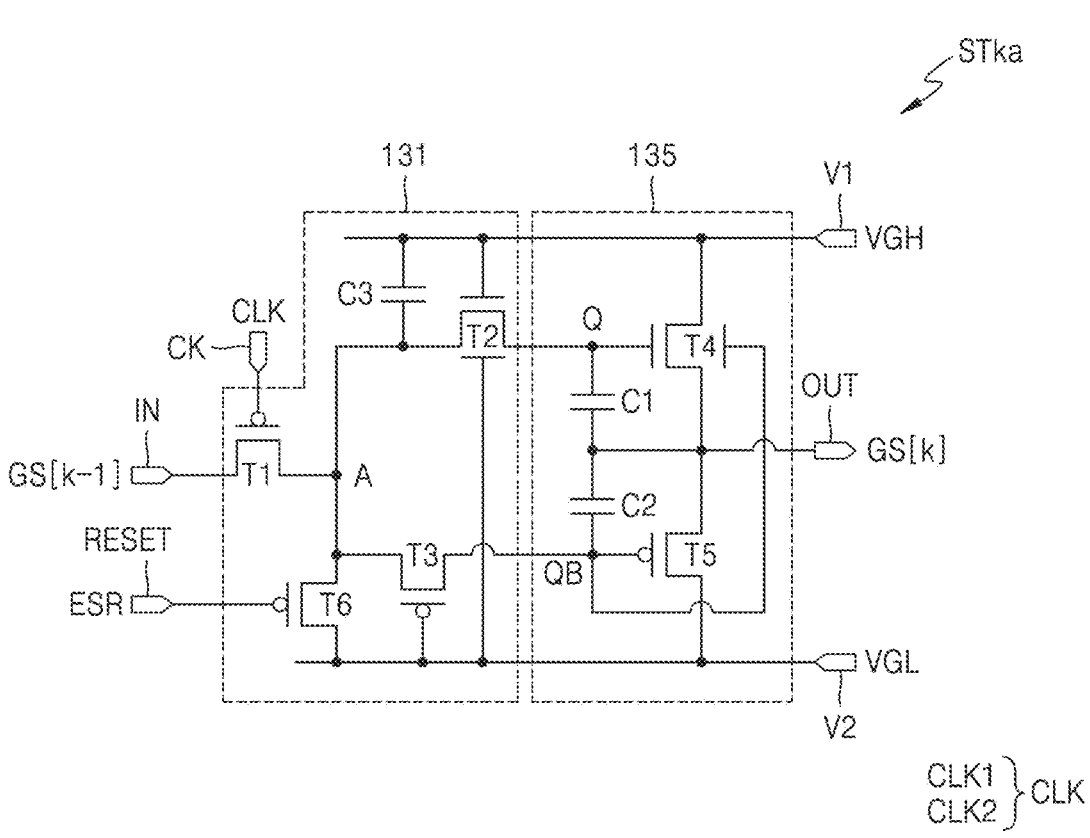
FIG. 5 is a circuit diagram illustrating an example of a stage included in the driving circuit of FIG. 3, according to an embodiment.
Figure 6:
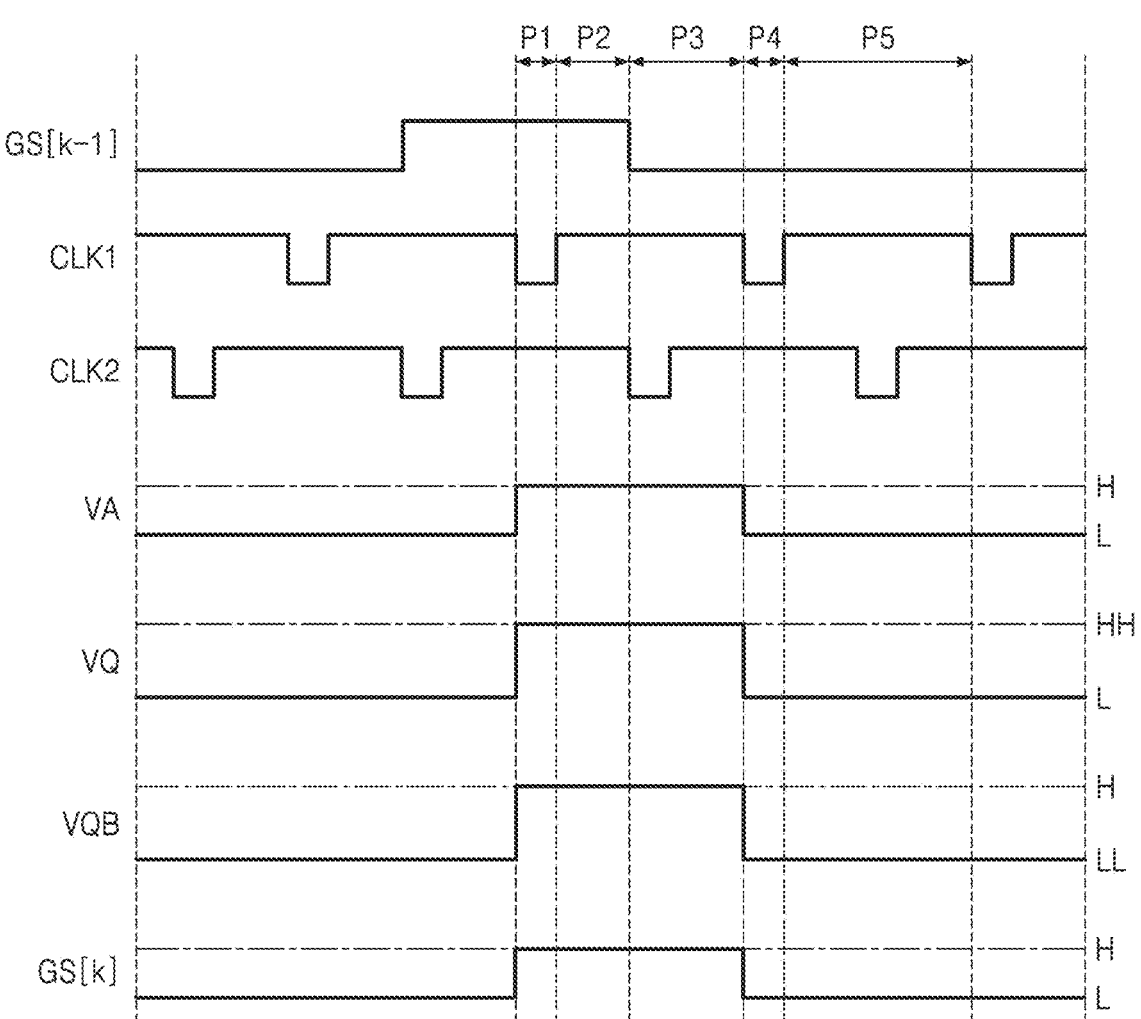
FIG. 6 is a timing diagram describing the driving of the stage of FIG. 5, according to an embodiment.
Figure 7B:
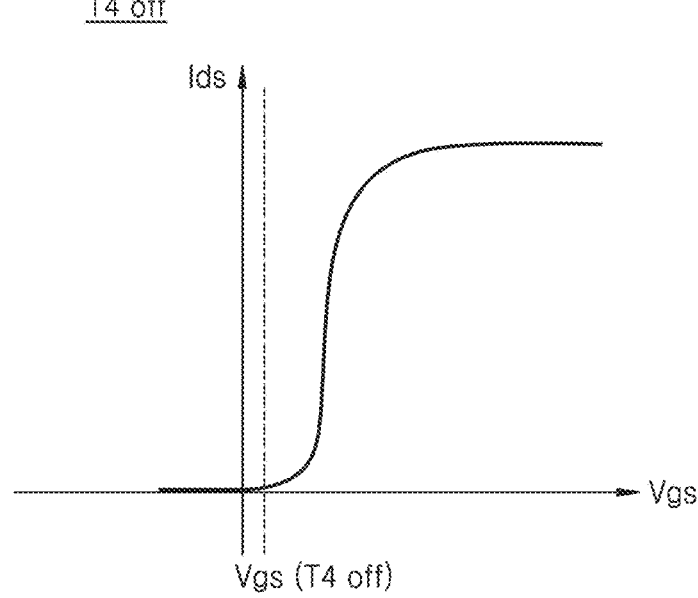
FIG. 7B is a diagram schematically illustrating a voltage-current graph of a transistor in a particular section, according to an embodiment.

FIG. 5 is a circuit diagram illustrating an example of a stage included in the driving circuit of FIG. 3, according to an embodiment. FIG. 6 is a timing diagram describing the driving of the stage of FIG. 5, according to an embodiment.

In an embodiment and referring to FIG. 5, a stage STka may include a control circuit 131 and an output circuit 135, where each of the control circuit 131 and the output circuit 135 may include at least one transistor. The at least one transistor may include an N-type transistor and/or a P-type transistor. For example, a first transistor T1, a third transistor T3, a fifth transistor T5, and a sixth transistor T6 of the stage STka may be P-type transistors, and a second transistor T2 and a fourth transistor T4 thereof may be N-type transistors. In an embodiment, each of the second transistor T2 and the fourth transistor T4 may be a four-terminal device including a source, a drain, a gate, and a back gate. A gate-on voltage of the P-type transistor may be a low-level voltage, and a gate-off voltage thereof may be a high-level voltage. A gate-on voltage of the N-type transistor may be a high-level voltage, and a gate-off voltage thereof may be a low-level voltage. Hereinafter, the high-level voltage may be a first voltage level H (hereinafter, referred as high level H) (see FIG. 6), the low-level voltage may be a second voltage level L (hereinafter, referred as low level L) (see FIG. 6), a high-level voltage higher than the high level may be a third voltage level HH (see FIG. 6), and a low-level voltage lower than the low level may be a fourth voltage level LL (see FIG. 6).

Additionally, depending on the transistor type (P-type or N-type) and/or operation condition, a first terminal of each of the first to sixth transistors T1 to T6, respectively, may be a source or a drain and a second terminal thereof may be a terminal different from the first terminal. For example, when the first terminal is a source, the second terminal may be a drain.

The control circuit 131 may control the voltages of a first node Q and a second node QB in response to the signals being input to an input terminal IN and a clock terminal CK.

For example, the control circuit 131 may control the voltages of the first node Q and the second node QB in response to the start signal (e.g., the external signal FLM (see FIG. 3) or the previous output signal) or the clock signal CLK. FIG. 5 illustrates an example in which a kth stage STka receives an input of a previous output signal GS[k−1] being output from a (k−1)th stage as a start signal and outputs an output signal GS[k]. Referring to FIG. 5, in an embodiment, the control circuit 131 may include the first to third transistors T1 to T3, and the sixth transistor T6. The control circuit 131 may further include a third capacitor C3.

In an embodiment, the first transistor T1 may be connected between the input terminal IN and a third node A. A gate of the first transistor T1 may be connected to the clock terminal CK. When the first clock signal CLK1 or the second clock signal CLK2 being input to the clock terminal CK is at a low level, the first transistor T1 may be turned on to transmit the start signal GS[k−1] being input through the input terminal IN to the third node A. In an embodiment, the first clock signal CLK1 or the second clock signal CLK2 may be input to the clock terminal CK of each of the odd-numbered stages ST1, ST3, . . . , and the second clock signal CLK2 or the first clock signal CLK1 may be input to the clock terminal CK of each of the even-numbered stages ST2, ST4, . . . .

In an embodiment, the second transistor T2 may be connected between the first node Q and the third node A. A gate of the second transistor T2 may be connected to the first voltage input terminal V1 configured to supply the first voltage VGH, and a back gate thereof may be connected to the second voltage input terminal V2 configured to supply the second voltage VGL. The second transistor T2 may be turned on by the first voltage VGH input to the first voltage input terminal V1 and may be configured to transmit a voltage of the third node A to the first node Q.

In an embodiment, the third transistor T3 may be connected between the second node QB and the third node A. A gate of the third transistor T3 may be connected to the second voltage input terminal V2 configured to supply the second voltage VGL. The third transistor T3 may be turned on by the second voltage VGL being input to the second voltage input terminal V2 and may be configured to transmit a voltage of the third node A to the second node QB.

In an embodiment, the sixth transistor T6 may be connected between the second voltage input terminal V2 and the third node A. A gate of the sixth transistor T6 may be connected to the reset terminal RESET such that when a low-level reset signal ESR is applied to the reset terminal RESET, the sixth transistor T6 may be turned on to set the voltage of the third node A to the second voltage VGL.

In an embodiment, the third capacitor C3 may be connected between the third node A and the first voltage input terminal V1, where the voltage difference between the third node A and the first voltage input terminal V1 may be stored in the third capacitor C3.

In an embodiment, the output circuit 135 may be connected between the first voltage input terminal V1 and the second voltage input terminal V2. The output circuit 135 may output an output signal GS[k] of a first voltage level voltage or a second voltage level voltage depending on the voltage level of the first node Q and the second node QB. The first voltage level voltage may be a high-level voltage, and the second voltage level voltage may be a low-level voltage. The output circuit 135 may include the fourth transistor T4 and the fifth transistor T5 and may further include a first capacitor C1 and a second capacitor C2.

In an embodiment, the fourth transistor T4 may be connected between the first voltage input terminal V1 and the output terminal OUT. A gate of the fourth transistor T4 may be connected to the first node Q, and a back gate thereof may be connected to the second node QB. The fourth transistor T4 may be a pull-up transistor which is configured to transmit a high-level voltage to the output terminal OUT. When the first node Q is at a high level, the fourth transistor T4 may be turned on to transmit the first voltage VGH input through the first voltage input terminal V1 to the output terminal OUT.

In an embodiment, the fifth transistor T5 may be connected between the second voltage input terminal V2 and the output terminal OUT and a gate of the fifth transistor T5 may be connected to the second node QB.

The fifth transistor T5 may be a pull-down transistor configured to transmit a low-level voltage to the output terminal OUT. When the second node QB is at a low level, the fifth transistor T5 may be turned on to transmit the second voltage VGL being input through the second voltage input terminal V2 to the output terminal OUT. The first capacitor C1 may be connected between the first node Q and the output terminal OUT. Even when the first transistor T1 is turned off, the voltage of the first node Q may be maintained by the first capacitor C1. When the voltage level at the output terminal OUT transitions from the second voltage level to the first voltage level, the first voltage level of the first node Q may be up-bootstrapped to the third voltage level by the coupling of the first capacitor C1.

In an embodiment, the second capacitor C2 may be connected between the second node QB and the output terminal OUT. Even when the first transistor T1 is turned off, the voltage of the second node QB may be maintained by the second capacitor C2. When the voltage level at the output terminal OUT transitions from the first voltage level to the second voltage level, the second voltage level of the second node QB may be down-bootstrapped to the fourth voltage level by the coupling of the second capacitor C2.

FIG. 6 illustrates an embodiment where a previous output signal GS[k−1] is a start signal, a first clock signal CLK1 is being input to the clock terminal CK of each of the odd-numbered stages ST1, ST3, . . . , a second clock signal CLK2 is being input to the clock terminal CK of each of the even-numbered stages ST2, ST4, . . . , a voltage VQ of the first node Q, a voltage VQB of the second node QB, a voltage VA of the third node A, and an output signal GS[k]. The second clock signal CLK2 may be shifted by a half period from the first clock signal CLK1. An example in which the k-th stage STka is an odd-numbered stage receiving an input of the first clock signal CLK1 through the clock terminal CK will be described below with reference to FIG. 6. With the exception that the external signal FLM is being input as a start signal to the input terminal IN, the other operation principles of the first stage ST1 may be the same as those in the following detailed description. The operations of the odd-numbered stages ST1, ST3, . . . may be similarly applied to the operation of the even-numbered stages. In a first section P1, the previous output signal GS[k−1] of the high level H may be supplied from the previous stage to the input terminal IN, and the first clock signal CLK1 of the low level L may be supplied to the clock terminal CK. In this case, the previous output signal GS[k−1] of the high level H transmitted to the input terminal IN may be an output signal output from the previous even-numbered stage in response to the second clock signal CLK2 of the low level L.

The first transistor T1 may be turned on by the first clock signal CLK1 of the low level L. The second transistor T2 turned on by the first voltage VGH that was supplied to the gate thereof may be turned off when a backgate-source voltage Vbs of the second transistor T2 becomes Vbs(T2)<0 as the voltage VA of the third node A changes from the low level L to the high level H. The third transistor T3 may be turned on by the second voltage VGL of the low level L.

The previous output signal GS[k−1] of the high level H may be transmitted to the third node A by the turned-on first transistor T1, and the voltage VA of the third node A may transition from the low level L to the high level H. The voltage VA of the high level H of the third node A may be transmitted to the first node Q by the second transistor T2 which is turned-on by the first voltage VGH being supplied to the gate thereof. Accordingly, the fourth transistor T4 may be turned on and thus the first voltage VGH of the high level H may be transmitted to the output terminal OUT. Thus, the output signal GS [k] of the high level H may be output from the output terminal OUT by the turned-on fourth transistor T4.

Moreover, the voltage VA of the high level H of the third node A may be transmitted to the second node QB by the third transistor T3 which is turned-on by the second voltage VGL supplied to the gate thereof, and the voltage VQB of the second node QB may be a voltage of the high level H. Accordingly, the fifth transistor T5 may be turned off. The voltage difference between the output terminal OUT and the first node Q may be stored in the first capacitor C1.

As the voltage VA of the third node A rises to the high level H, when the backgate-source voltage Vbs becomes Vbs(T2)<0 of the second transistor T2, the second transistor T2 may be turned off and the electrical connection of the first node Q to the third node A may be disconnected. As the voltage of the output terminal OUT rises from the low level L to the high level H, the voltage VQ of the first node Q may be up-bootstrapped to the third voltage level HH by the coupling of the first capacitor C1. The voltage difference between the output terminal OUT and the first node Q may be stored in the first capacitor C1.

In a second section P2, the previous output signal GS[k−1] of the high level may be supplied to the input terminal IN, and the first clock signal CLK1 of the high level may be supplied to the first clock terminal CK1.

The first transistor T1 may be turned off by the first clock signal CLK1 of the high level H and the second transistor T2 may be turned off because the backgate-source voltage Vbs of the second transistor T2 becomes Vbs<0 due to the voltage VA of the high level H of the third node A. The third transistor T3 may be turned on by the second voltage VGL of the low level L.

In the second section P2, the voltage VA of the third node A may maintain the high level H in the first section P1 as the first transistor T1 is turned off. The voltage VQ of the first node Q may maintain the third voltage level HH by the first capacitor C1, and accordingly, the fourth transistor T4 may be turned on. The first voltage VGH may be transmitted to the output terminal OUT by the turned-on fourth transistor T4 and the voltage VA of the high level H of the third node A may be transmitted to the second node QB by the third transistor T3 maintaining the turn-on state by the second voltage VGL supplied to the gate thereof, and the voltage VQB of the second node QB may be a voltage of the high level H. Accordingly, the fifth transistor T5 may be turned off.

Thus, the output signal GS[k] of the high level H may be output from the output terminal OUT by the turned-on fourth transistor T4. The voltage difference between the output terminal OUT and the first node Q may be stored in the first capacitor C1.

In a third section P3, the previous output signal GS[k−1] of the low level L may be supplied to the input terminal IN, and the first clock signal CLK1 of the high level H may be supplied to the clock terminal CK.

The voltage level supplied to the input terminal IN in the third section P3 may be at the low level L, and the voltage level of the signal supplied to the input terminal IN in the second section P2 may be at the high level H, which may be different from each other. However, the first transistor T1 may be turned off by the first clock signal CLK1 of the high level H, and accordingly, the voltage levels of the voltage VQ of the first node Q, the voltage VQB of the second node QB, the voltage VA of the third node A, and the output signal GS[k] in the second section P2 may also be maintained in the third section P3.

In a fourth section P4, the previous output signal GS[k−1] of the low level L may be supplied to the input terminal IN, and the first clock signal CLK1 of the low level L may be supplied to the clock terminal CK.

The first transistor T1 may be turned on by the first clock signal CLK1 of the low level L, the second transistor T2 may be turned on by the first voltage VGH and the third transistor T3 may be turned off as the voltage VA of the third node A changes to the second voltage level L.

The previous output signal GS[k−1] of the low level L may be transmitted to the third node A by the turned-on first transistor T1, and the voltage VA of the third node A may be at the low level L. As the voltage VA of the third node A falls to the low level L, because a backgate-source voltage Vbs of the second transistor T2 may become Vbs(T2)=0 and a gate-source voltage Vgs of the second transistor T2 may become Vgs(T2)>0, the second transistor T2 may be turned on. By the turned-on second transistor T2, the voltage VA of the low level L of the third node A may be transmitted to the first node Q, and the voltage VQ of the first node Q may be at the low level L. Accordingly, the fourth transistor T4 may be turned off.

Additionally, the voltage VA of the high level H of the third node A may be transmitted to the second node QB by the third transistor T3 maintaining the turn-on state by the second voltage VGL being supplied to the gate thereof. Accordingly, the fifth transistor T5 may be turned on and thus the second voltage VGL of the low level L may be transmitted to the output terminal OUT. Thus, the output signal GS[k] of the low level L may be output from the output terminal OUT by the turned-on fifth transistor T5. The voltage difference between the output terminal OUT and the second node QB may be stored in the second capacitor C2.

As the voltage VA of the third node A falls to the low level L, when the gate-source voltage Vgs becomes Vgs(T3)=0 of the third transistor T3, the third transistor T3 may be turned off and the electrical connection of the second node QB to the third node A may be disconnected. As the voltage of the output terminal OUT falls from the high level H to the low level L, the voltage VQB of the second node QB may be down-bootstrapped to the fourth voltage level LL by the coupling of the second capacitor C2.

In a fifth section P5, the previous output signal GS[k−1] of the low level L may be supplied to the input terminal IN, and the first clock signal CLK1 of the high level H may be supplied to the clock terminal CK.

The first transistor T1 may be turned off by the first clock signal CLK1 of the high level H and the second transistor T2 may be turned on by the first voltage VGH. The third transistor T3 may maintain the turned-off state as the voltage VA of the third node A is maintained at the low level L by the turned-off first transistor T1.

In the fifth section P5, the voltage VA of the third node A may maintain the low level L in the fourth section P4 as the first transistor T1 is turned off. By the turned-on second transistor T2, the voltage VA of the third node A may be transmitted to the first node Q, and the voltage VQ of the first node Q may be at the low level L. Accordingly, the fourth transistor T4 may maintain the turn-off state. The voltage VQB of the second node QB may maintain the fourth voltage level LL by the second capacitor C2, and accordingly, the fifth transistor T5 may be turned on. The second voltage VGL may be transmitted to the output terminal OUT by the turned-on fifth transistor T5.

Thus, the output signal GS [k] of the low level L may be output from the output terminal OUT by the turned-on fifth transistor T5. The voltage difference between the output terminal OUT and the second node QB may be stored in the second capacitor C2.

FIGS. 7A, 8A, 9A, and 10A are diagrams for describing a signal input to a terminal connected to a transistor included in a stage, according to an embodiment. FIGS. 7B, 8B, 9B, and 10B are diagrams schematically illustrating a voltage-current graph of a transistor in a particular section, according to an embodiment.

In an embodiment and referring to FIGS. 7A, 8A, 9A, and 10A, each of the second transistor T2 and the fourth transistor T4 included in the stage STka illustrated in FIG. 5 may be an N-type oxide transistor and may be a four-terminal device including a source, a drain, a gate, and a back gate.

In an embodiment, an alternating current (AC) voltage may be applied to the gate and/or the back gate of each of the second transistor T2 and the fourth transistor T4. For example, a low-level voltage may be applied to the gate and/or the back gate of each of the second transistor T2 and the fourth transistor T4 in some sections among the operation sections of the stage STka, and a high-level voltage may be applied thereto in some other sections thereof. In an embodiment, the AC voltage may be a voltage of a certain node whose voltage level changes in the stage STka.

FIG. 7A illustrates a state in which the fourth transistor T4 is turned off after the fourth section P4. In an embodiment, the source electrode of the fourth transistor T4 is connected to the output terminal OUT, and the source electrode voltage of the fourth transistor T4 may be the voltage of the output terminal OUT. Because the voltage of the output terminal OUT after the fourth section P4 is the second voltage VGL, the second voltage VGL may be supplied to the source electrode of the fourth transistor T4. The drain electrode of the fourth transistor T4 may be connected to the first voltage input terminal V1 to supply the first voltage VGH.

The gate of the fourth transistor T4 may be connected to the first node Q, and the voltage VA of the third node A may be transmitted to the first node Q by the turned-on second transistor T2. In the fourth section P4, by the turned-on first transistor T1, the voltage of the previous output signal GS[k−1] of the low level L may be reduced by the threshold voltage Vth of the first transistor T1 which is a P-type transistor and then transmitted to the third node A. In an embodiment, the voltage of the previous output signal GS[k−1] of the low level L may be the second voltage VGL. In this embodiment, the voltage VA of the third node A may be given by VGL+|Vth| which is smaller by the threshold voltage Vth than the second voltage VGL. The voltage VA of the third node A may be transmitted to the first node Q by the turned-on second transistor T2, and a voltage given by VGL+|Vth| may be supplied to the gate of the fourth transistor T4. Because the gate-source voltage Vgs of the fourth transistor T4 is given by $Vgs(T4)=(VGL+|Vth|)−VGL$ and $Vgs(T4)=|Vth|>0$, the fourth transistor T4 that should be turned off may be turned on and thus the voltage level of the output signal may be changed.

In an embodiment, the back gate of the fourth transistor T4 may be connected to the second node QB. In an embodiment, after the fourth section P4, the voltage VQB of the second node QB may be the fourth voltage level LL, and the voltage of the fourth voltage level LL may be 2 VGL which is about two times the second voltage VGL. Thus, a voltage of about 2 VGL may be supplied to the back gate of the fourth transistor T4. In this case, referring to FIG. 7B, because the backgate-source voltage Vbs of the fourth transistor T4 is given by $Vbs(T4)=2VGL−VGL$ and $Vbs(T4)=VGL<0$, as the threshold voltage of the fourth transistor T4 is positively shifted, the current-voltage graph may move to the right and the fourth transistor T4 may be completely turned off.

Figure 8A:
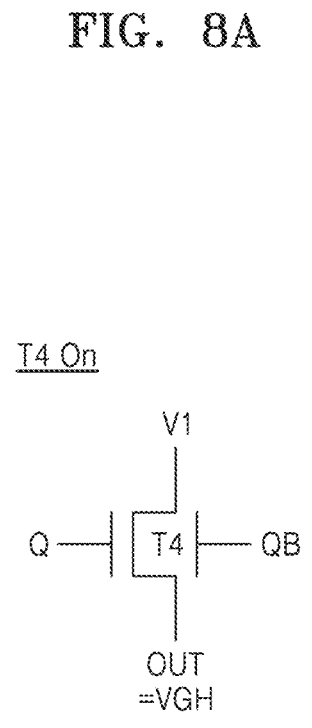

FIG. 8A illustrates an embodiment of a state in which the fourth transistor T4 is turned on in the first section P1, the second section P2, and the third section P3. The drain electrode of the fourth transistor T4 may be connected to the first voltage input terminal V1 to supply the first voltage VGH.

The gate of the fourth transistor T4 may be connected to the first node Q. In an embodiment, in the first section P1, the second section P2, and the third section P3, the voltage VQ of the first node Q may be the third voltage level HH, and the voltage of the third voltage level HH may be given by 2 VGH which is about two times the first voltage VGH. Thus, a voltage of about 2 VGH may be supplied to the gate of the fourth transistor T4.

The back gate of the fourth transistor T4 may be connected to the second node QB. In an embodiment, in the first section P1, the second section P2, and the third section P3, the voltage VQB of the second node QB may be the first voltage level H. Thus, a voltage of the first voltage VGH may be supplied to the back gate of the fourth transistor T4.

Figure 8B:
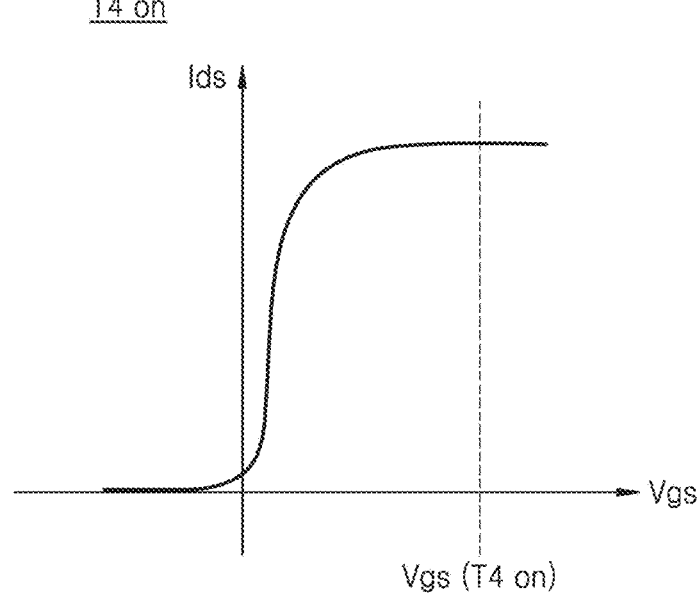
FIG. 8B is a diagram schematically illustrating a voltage-current graph of a transistor in a particular section, according to an embodiment.

In an embodiment and referring to FIG. 8B, the gate-source voltage Vgs of the fourth transistor T4 may be given by $Vgs(T4)=2 VGH−VGH$, and $Vgs(T4)=VGH>0$. In this case, the gate-source voltage Vgs of the fourth transistor T4 may become greater than the threshold voltage (Vth) and thus a current Ids may flow in the turn-on state of the fourth transistor T4. Unlike when the fourth transistor T4 is turned off, the backgate-source voltage Vbs of the fourth transistor T4 may be given by $Vbs(T4)=VGH−VGH$, and $Vbs(T4)=0$. Thus, the characteristics of the threshold voltage and current-voltage graph of the positively shifted fourth transistor T4 may be restored by moving to the left and thus a current Ids may flow by the turned-on fourth transistor T4. Thus, by the turned-on fourth transistor T4, the first voltage VGH may be supplied to the source electrode of the fourth transistor T4 which is connected to the output terminal OUT.

Figure 9A:
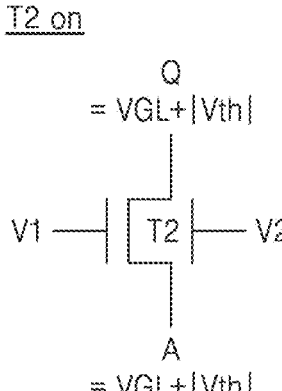
FIG. 9A is a diagram for describing a signal input to a terminal connected to a transistor included in a stage, according to an embodiment.

FIG. 9A illustrates a state in which the second transistor T2 is turned on after the fourth section P4. In an embodiment, the source electrode of the second transistor T2 may be connected to the third node A. In the fourth section P4, by the turned-on first transistor T1, the voltage of the previous output signal GS[k−1] of the low level L may be reduced by the threshold voltage Vth of the first transistor T1 which is a P-type transistor and then may be transmitted to the third node A. In an embodiment, the voltage of the previous output signal GS[k−1] of the low level L may be the second voltage VGL. In this case, the voltage VA of the third node A may be given by VGL+|Vth| which is smaller by the threshold voltage Vth than the second voltage VGL. The voltage VA (VGL+|Vth|) of the third node A in the fourth section P4 may also be maintained after the fifth section P5.

The gate of the second transistor T2 may be connected to the first voltage input terminal V1 to supply the first voltage VGH, and the back gate of the second transistor T2 may be connected to the second voltage input terminal V2 to supply the second voltage VGL.

Figure 9B:
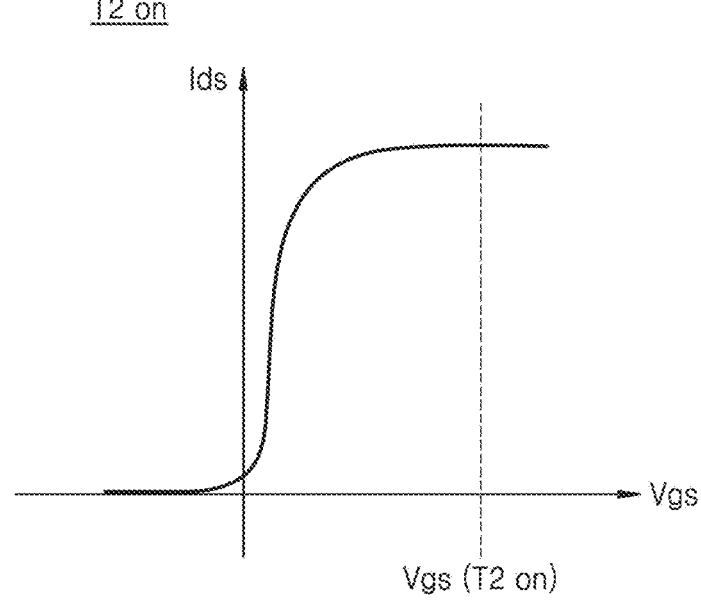
FIG. 9B is a diagram schematically illustrating a voltage-current graph of a transistor in a particular section, according to an embodiment.

Referring to FIG. 9B, the gate-source voltage Vgs of the second transistor T2 may be given by Vgs(T2)=VGH−(VGL+|Vth|), and Vgs>0. In this case, the gate-source voltage Vgs of the second transistor T2 may become greater than the threshold voltage (Vth) and thus a current Ids may flow in the turn-on state of the second transistor T2. Unlike when the second transistor T2 is turned off, the backgate-source voltage Vbs of the second transistor T2 in the turn-on state may be Vbs(T2)=(VGL+|Vth|)−VGL, and Vbs(T2)=|Vth|≈0. Thus, as described below, the characteristics of the current-voltage graph of the positively shifted second transistor T2 may be restored by moving to the left and thus a current Ids may flow by the turned-on second transistor T2. The voltage VA of the third node A may be transmitted to the first node Q by the turned-on second transistor T2, and a voltage of VGL+|Vth| may be supplied to the drain electrode of the second transistor T2.

Figure 10A:
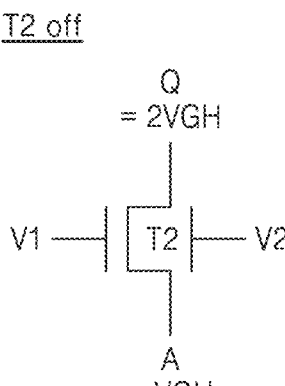
FIG. 10A is a diagram for describing a signal input to a terminal connected to a transistor included in a stage, according to an embodiment.

FIG. 10A illustrates an embodiment where a state in which the second transistor T2 is turned off in the first section P1, the second section P2, and the third section P3. The gate of the second transistor T2 may be connected to the first voltage input terminal V1 to supply the first voltage VGH, and the back gate of the second transistor T2 may be connected to the second voltage input terminal V2 to supply the second voltage VGL. In an embodiment, the source electrode of the second transistor T2 may be connected to the third node A. In the first section P1, the first voltage VGH that is the previous output signal GS[k−1] may be transmitted to the third node A by the turned-on first transistor T1. The first voltage VGH of the high level transmitted to the third node A in the first section P1 may also be maintained in the second section P2 and the third section P3.

The drain electrode of the second transistor T2 may be connected to the first node Q. The first voltage VGH that is the voltage VA of the third node A may be transmitted to the first node Q by the turned-on second transistor T2, and accordingly, the fourth transistor T4 may be turned on.

Figure 10B:
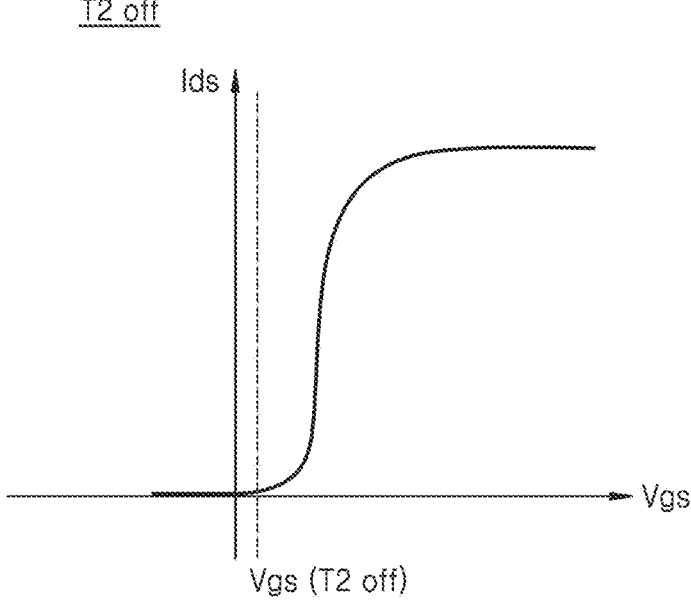
FIG. 10B is a diagram schematically illustrating a voltage-current graph of a transistor in a particular section, according to an embodiment.

In an embodiment and referring to FIG. 10B, the gate-source voltage Vgs of the second transistor T2 may be given by Vgs(T2)=VGH−VGH, and Vgs(T2)=0. The backgate-source voltage Vbs of the second transistor T2 may be given by Vbs(T2)=VGL−VGH, and Vbs(T2)<0. Thus, as the threshold voltage of the second transistor T2 is positively shifted, the current-voltage graph may move to the right and the second transistor T2 may be turned off. The voltage VQ of the first node Q may rise to the third voltage level HH by the coupling the first capacitor C1. The voltage of the third voltage level HH may be given by 2 VGH which is about two times greater than the first voltage VGH. Thus, a voltage of about 2 VGH may be supplied to the drain electrode of the second transistor T2.

FIGS. 11A, 11B, 11C, 11D, 12, 13, and 14 each show a circuit diagram illustrating an example of a stage included in the driving circuit of FIG. 3, according to an embodiment. FIGS. 11A, 11B, 11C, 11D, 12, 13, and 14 respectively illustrate various modifications of the circuit included in the stage STka of FIG. 5. Because FIGS. 11A, 11B, 110, 11D, 12, 13, and 14 are the same as or are partially different from a portion of the circuit diagram illustrated in FIG. 5, differences from FIG. 5, according to an embodiment, will be mainly described.

Figure 11A:
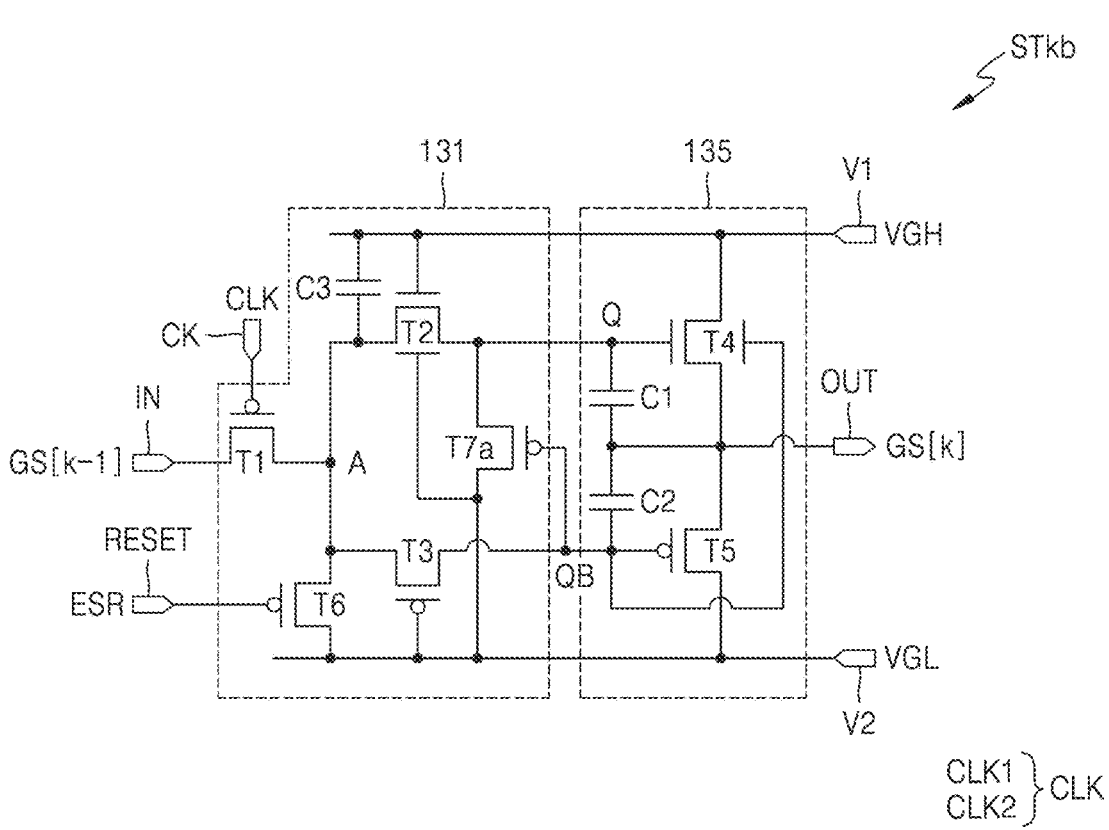
FIG. 11A is a circuit diagram illustrating an example of a stage included in the driving circuit of FIG. 3, according to an embodiment.

In an embodiment and referring to FIG. 11A, a stage STkb is an example in which a seventh transistor T7a is further included in the control circuit 131 of the stage STka illustrated in FIG. 5. In an embodiment, the seventh transistor T7a may be a P-type silicon transistor.

The seventh transistor T7a may be connected between the first node Q and the second voltage input terminal V2. The gate of the seventh transistor Ta may be connected to the second node QB. As such, when the voltage VQB of the second node QB is at the low level, the seventh transistor T7a may be turned on and the second voltage VGL input through the second voltage input terminal V2 may be transmitted to the first node Q.

When the stage STkb further includes the seventh transistor T7a, because the second voltage VGL may be directly supplied from the second voltage input terminal V2 to the first node Q even when the previous output signal GS[k−1] is at the low level, the voltage of the first node Q may be the second voltage VGL rather than a voltage given by (VGL+|Vth|) which is smaller by the threshold voltage Vth than the second voltage VGL and the gate-source voltage Vgs of the fourth transistor T4 may be given by Vgs(T4)=0. Thus, the gate-source voltage Vbs of the fourth transistor T4 may be lower by |Vth| than the case illustrated in FIG. 5, and thus, the fourth transistor T4 may become a relatively stable turn-off state.

Figure 11B:
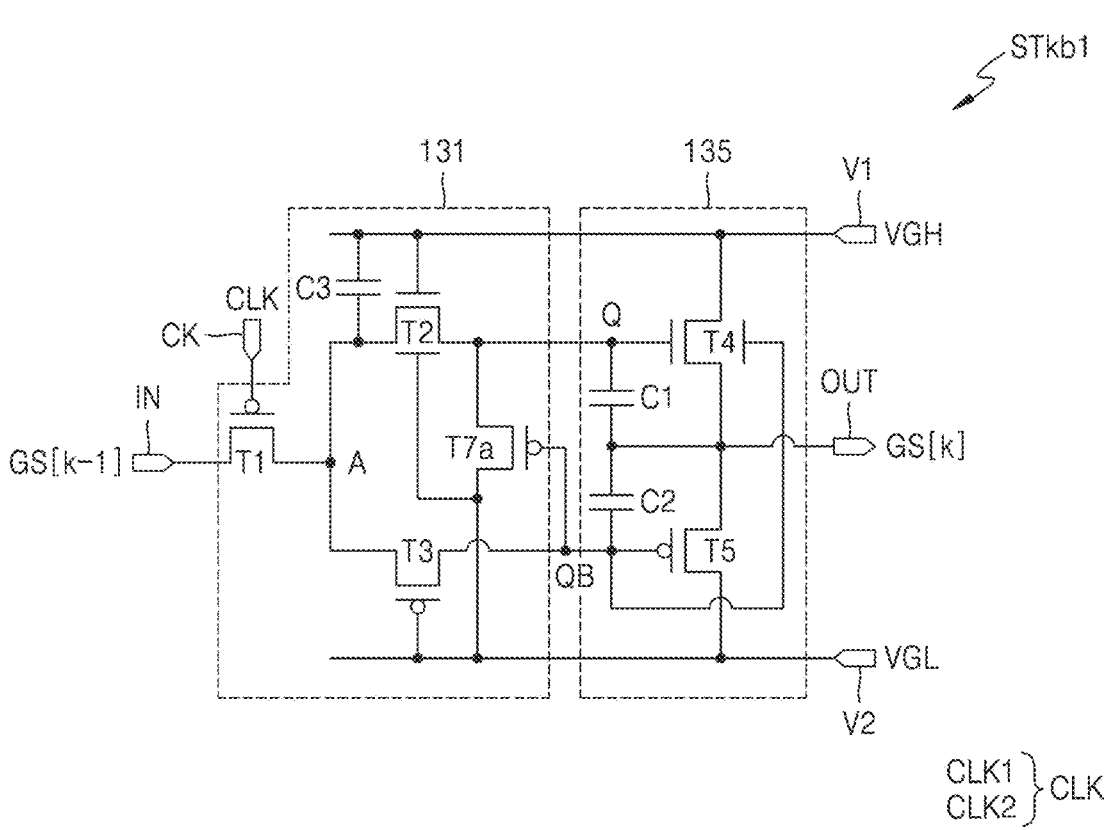
FIG. 11B is a circuit diagram illustrating an example of a stage included in the driving circuit of FIG. 3, according to an embodiment.
Figure 11C:
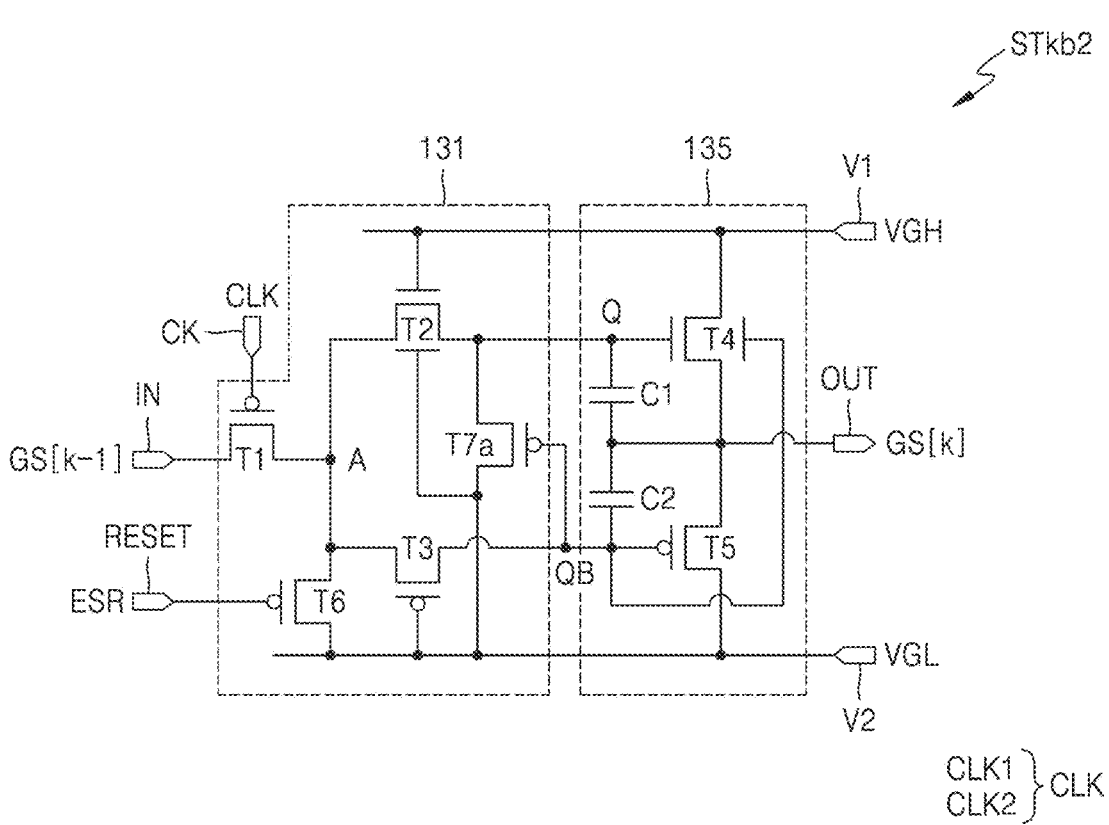
FIG. 11C is a circuit diagram illustrating an example of a stage included in the driving circuit of FIG. 3, according to an embodiment.
Figure 11D:
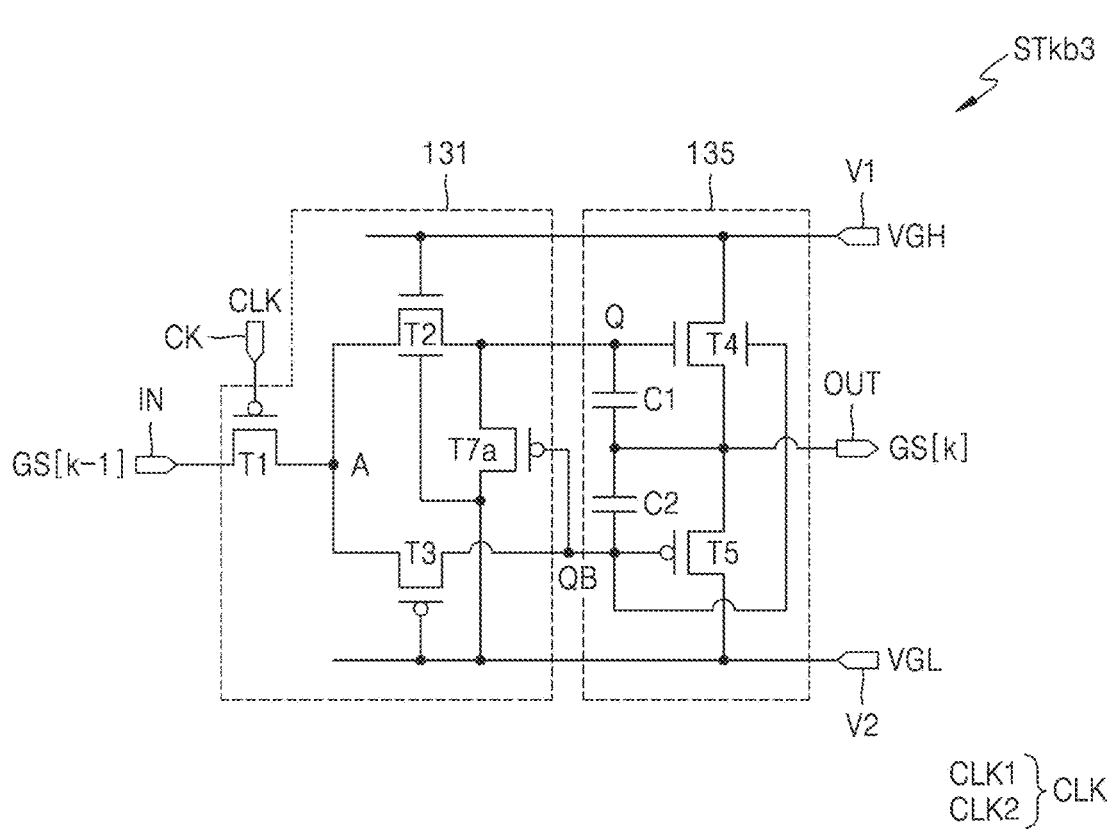
FIG. 11D is a circuit diagram illustrating an example of a stage included in the driving circuit of FIG. 3, according to an embodiment.

FIGS. 11B, 11C, and 11D respectively illustrate various modifications of the circuit included in the stage STkb of FIG. 11A.

A stage STkb1 shown in FIG. 11B may be an example in which the sixth transistor T6, which is a reset transistor initializing the voltage VA of the third node A to the second voltage VGL, is removed from the stage STkb of FIG. 11A.

A stage STkb2 shown in FIG. 11C may be an example in which the third capacitor C3 storing the voltage difference between the first voltage input terminal V1 and the third node A is removed from the stage STkb of FIG. 11A.

A stage STkb3 shown in FIG. 11D may be an example in which both the sixth transistor T6 and the third capacitor C3 are removed from the stage STkb of FIG. 11A.

FIGS. 11B, 11C, and 11D may be various embodiments that may reduce cost and dead space by removing elements that do not affect the core operation of the circuit included in the stage STkb illustrated in FIG. 11A.

Figure 12:
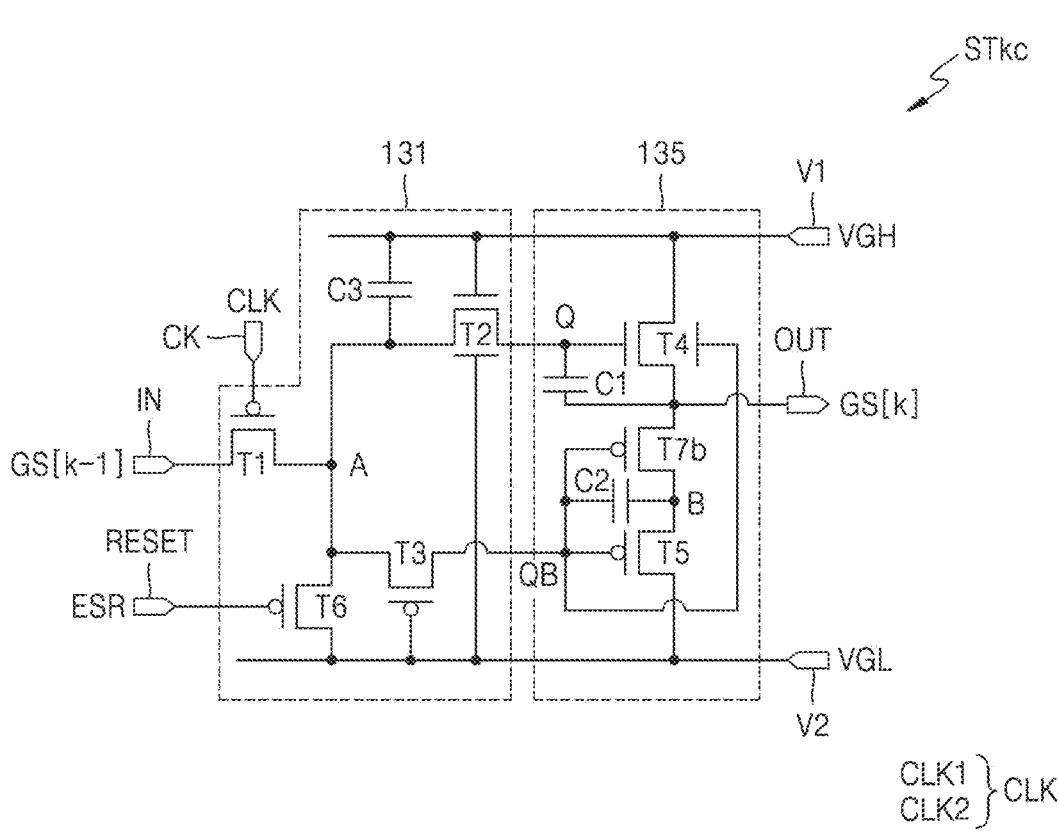
FIG. 12 is a circuit diagram illustrating an example of a stage included in the driving circuit of FIG. 3, according to an embodiment.

In an embodiment and referring to FIG. 12, a stage STkc may be an example in which the output circuit 135 of the stage STka illustrated in FIG. 5 further includes a seventh transistor T7b. In an embodiment, the seventh transistor T7b may be a P-type silicon transistor.

The seventh transistor T7b may be connected between a fourth node B and the output terminal OUT, where the fourth node B may be a node disposed between the fifth transistor T5 and the seventh transistor T7b. The gate of the seventh transistor T7b may be connected to the second node QB and the seventh transistor T7b may be turned on when the voltage VQB of the second node QB is at the low level. By connecting the seventh transistor T7b in series with the fifth transistor T5, a leakage current from the turned-off fifth transistor T5 may be blocked when the first voltage VGH of the high level is output from the output terminal OUT for a long time. Thus, a defect rate of a display apparatus 10 (see FIG. 15) may be reduced by preventing a leakage current from flowing into the output signal GS[k] output from the output terminal OUT.

Figure 13:
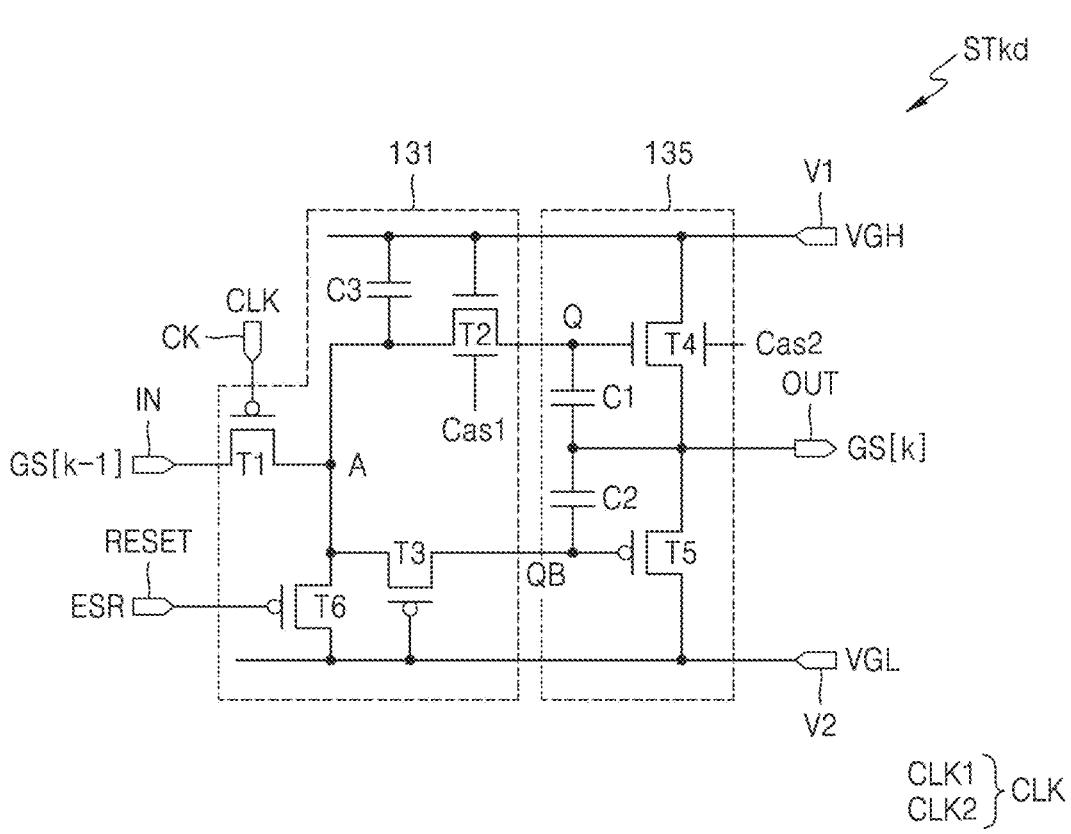
FIG. 13 is a circuit diagram illustrating an example of a stage included in the driving circuit of FIG. 3, according to an embodiment.

In an embodiment and referring to FIG. 13, a stage STkd may be an example in which a particular voltage is supplied to the back gate of each of the second transistor T2 and the fourth transistor T4 in the stage STka illustrated in FIG. 5. A first particular voltage Cas1 may be supplied to the back gate of the second transistor T2, and a second particular voltage Cas2 may be supplied to the back gate of the fourth transistor T4.

In an embodiment, the first particular voltage Cas1 may be the first voltage VGH. In this case, when the second transistor T2 is turned on, the backgate-source voltage Vbs may become Vbs(T2)=VGH−(VGL+|Vth|) and thus may become greater than Vbs(T2) in the case where the second voltage VGL is supplied to the backgate of the second transistor T2. Accordingly, the threshold voltage of the second transistor T2 may be negatively shifted, and thus, the current-voltage graph may move to the left and an current Ids may flow relatively well. And, when the second transistor T2 is turned off, because the backgate-source voltage Vbs becomes Vbs(T2)=VGH−VGH=0, the characteristics of the threshold voltage and current-voltage graph of the negatively shifted second transistor T2 may be restored by moving to the right.

In an embodiment, the first particular voltage Cas1 may be the voltage VA of the third node A. That is, a first particular voltage input terminal may be connected to a first terminal of the second transistor T2. In this case, the backgate-source voltage Vbs of the second transistor T2 may be given by Vbs(T2)=0. Thus, the second transistor T2 may be turned on and off depending on the gate-source voltage Vgs.

In an embodiment, the second particular voltage Cas2 may be a negative constant voltage (DC) and the value of the negative constant voltage (DC) applied as the second particular voltage Cas2 may be greater than the absolute value (|VGL|) of the second voltage VGL. In this case, when the fourth transistor T4 is turned off, the backgate-source voltage Vbs may become Vbs(T4)<0 and thus the threshold voltage of the fourth transistor T4 may be positively shifted. As the characteristics of the current-voltage graph of the fourth transistor T4 are positively shifted, the fourth transistor T4 may become a more stable turn-off state than the case of no back gate.

Figure 14:
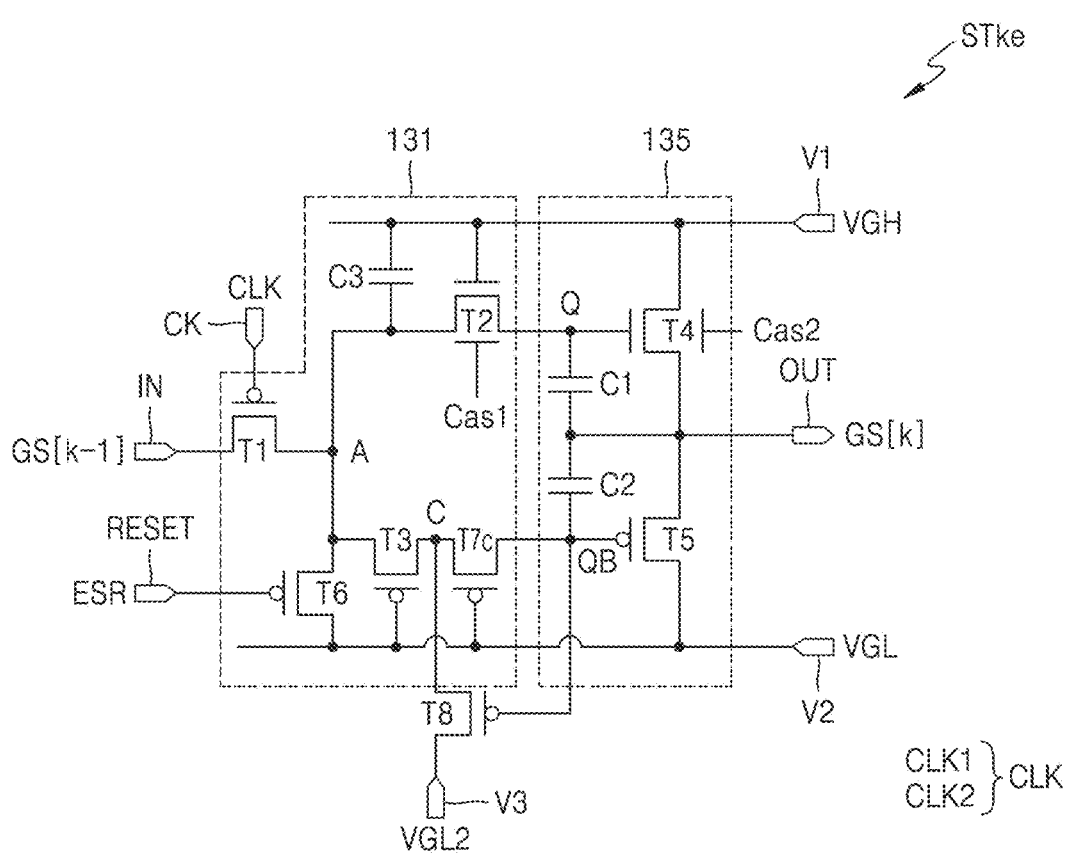
FIG. 14 is a circuit diagram illustrating an example of a stage included in the driving circuit of FIG. 3, according to an embodiment.

In an embodiment and referring to FIG. 14, a stage STke may further include a seventh transistor T7c and an eighth transistor T8 in the control circuit 131 of the stage STkd illustrated in FIG. 13. In an embodiment, the seventh transistor T7c and the eighth transistor T8 may be P-type silicon transistors.

The seventh transistor T7c may be connected between a fifth node C and the second node QB. The fifth node C may be a node disposed between the third transistor T3 and the seventh transistor T7c. The gate of the seventh transistor T7c may be connected to the second voltage input terminal V2. The eighth transistor T8 may be connected between the fifth node C and a fifth voltage input terminal V3 through which a fifth voltage VGL2 is supplied. The gate of the eighth transistor T8 may be connected to the second node QB. In an embodiment, the fifth voltage VGL2 may be a voltage level of the low level L and may be equal to or different from the second voltage VGL. For example, the fifth voltage VGL2 may be lower than the second voltage VGL.

In order to output the second voltage VGL of the low level from the output terminal OUT, the fourth transistor T4 should be stably turned off, and in this case, the voltage VQB of the second node QB connected to the backgate of the fourth transistor T4 should be maintained at 2 VGL. Particularly, in the case of driving at a low frequency such as 1 Hz, the voltage VQB of the second node QB should be maintained at 2 VGL for a considerable long time in order to output the second voltage VGL of the low level L from the output terminal OUT. In this case, a leakage current may occur from the third transistor T3 in the turned-off state, and accordingly, the voltage VQB of the second node QB may rise to about VGL. When the voltage VQB of the second node QB rises to about VGL, the fourth transistor T4 may not be completely turned off, and accordingly, as not the second voltage VGL but a voltage of (VGL+|Vth|) may be output from the output terminal OUT, a defect of the display apparatus 10 (see FIG. 15) may occur.

In an embodiment, the fifth voltage VGL2 of the low level L may be supplied to the fifth node C between the third transistor T3 and the second node QB, and the seventh transistor T7c may be connected in series to the third transistor T3 in order to block a leakage current of the third transistor T3. The third transistor T3 and the seventh transistor T7c may be connected in series to each other to minimize a leakage current of the third transistor T3, and thus, the voltage of the second node QB may be stably maintained and the defect rate of the display apparatus 10 (see FIG. 15) may be reduced.

Figure 15:
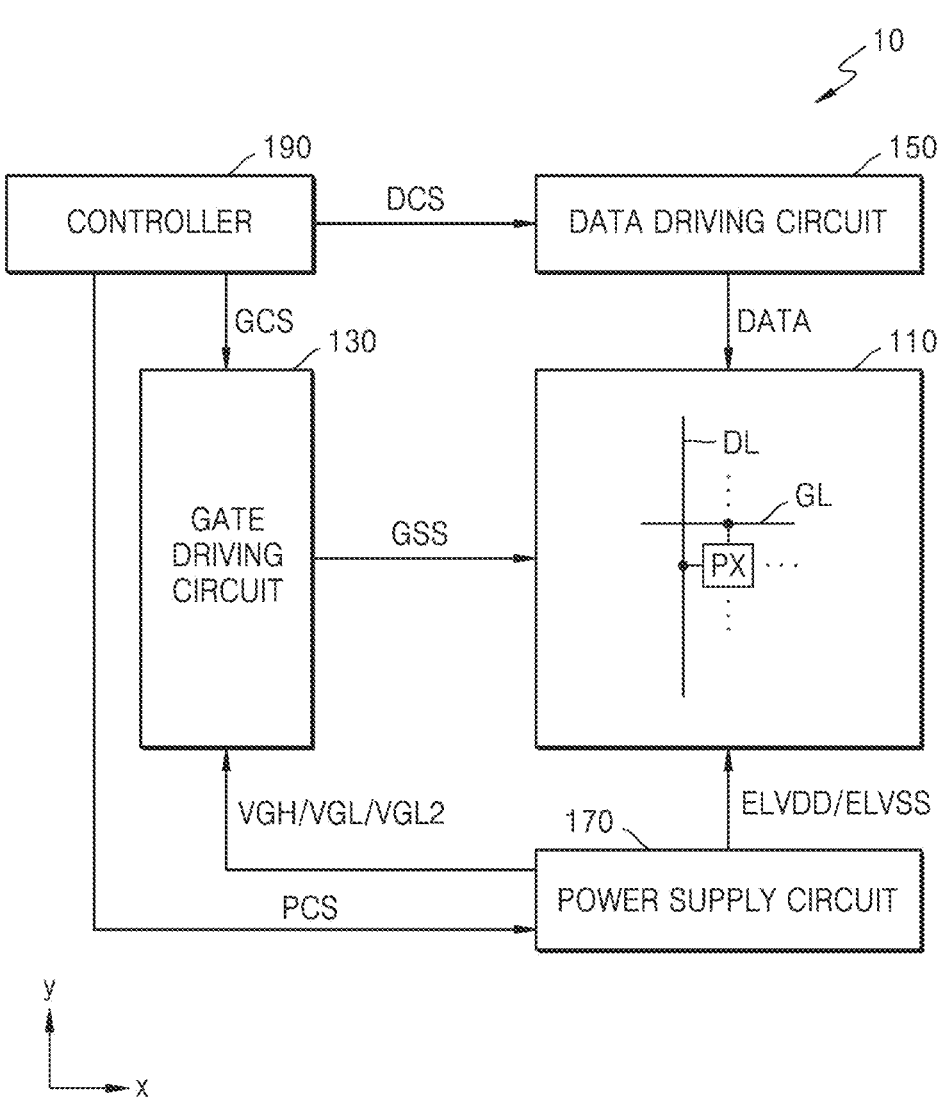
FIG. 15 is a diagram schematically illustrating a display apparatus, according to an embodiment.

FIG. 15 is a diagram schematically illustrating a display apparatus, according to an embodiment.

In an embodiment and referring to FIG. 15, a display apparatus 10 may include a pixel area 110, a gate driving circuit 130, a data driving circuit 150, a power supply circuit 170, and a controller 190.

The pixel area 110 may correspond to a display area that displays an image. Various conductive lines for transmitting electrical signals to be applied to the display area, peripheral driving circuits electrically connected to pixel circuits, and/or pads to which a printed circuit board or a driver IC chip is attached may be located in a peripheral area (non-display area) outside of the display area. For example, the gate driving circuit 130, the data driving circuit 150, the power supply circuit 170, and the controller 190 may be provided in the peripheral area.

A plurality of gate lines GL, a plurality of data lines DL, and a plurality of pixels PX connected thereto may be arranged in the pixel area 110. The plurality of pixels PX may be repeatedly arranged in a first direction (x direction or row direction) and a second direction (y direction or column direction). The plurality of pixels PX may be arranged in various forms such as stripe arrangement, pentile arrangement, diamond arrangement, and mosaic arrangement to implement an image. Each of the plurality of pixels PX may include an organic light emitting diode as a display element, and the organic light emitting diode may be connected to a pixel circuit. The pixel circuit may include a plurality of transistors and at least one capacitor. The pixel PX may emit, for example, red, green, blue, or white light from the organic light emitting diode (OLED). Each pixel PX may be connected to at least one corresponding gate line among the plurality of gate lines GL and a corresponding data line among the plurality of data lines DL.

In an embodiment, the plurality of transistors included in the pixel circuit may be P-type silicon transistors. In an embodiment, the plurality of transistors included in the pixel circuit may be N-type oxide transistors. In an embodiment, some of the plurality of transistors included in the pixel circuit may be P-type silicon transistors, and some others thereof may be N-type oxide transistors.

In an embodiment, each of the gate lines GL may extend in the x direction (row direction) to be connected to the pixels PX located in the same row. Each of the gate lines GL may be configured to transmit a gate signal to the pixels PX in the same row. Each of the data lines DL may extend in the y direction (column direction) to be connected to the pixels PX located in the same column. Each of the data lines DL may be configured to transmit a data signal to each of the pixels PX in the same column in synchronization with a gate signal.

The gate driving circuit 130 may be connected to a plurality of gate lines GL, may generate a gate signal GSS in response to a gate driving control signal GCS from the controller 190, and may sequentially supply the gate signal GSS to the gate lines GL. The gate line GL may be connected to a gate of the transistor included in the pixel PX, and the gate signal GSS may be a gate control signal for controlling the turn-on and turn-off of a transistor to which a gate line is connected. The gate signal GSS may include a gate-on voltage at which the transistor may be turned on and a gate-off voltage at which the transistor may be turned off. The gate driving circuit 130 may include a plurality of stages that sequentially generate and output the gate signal GSS.

In an embodiment, the gate driving circuit 130 may be implemented as the driving circuit DRV illustrated in FIG. 3. For example, the gate signal GSS output by the gate driving circuit 130 to each gate line GL may correspond to the high-level output signal GS output by each of the plurality of stages ST1 to STn of the driving circuit DRV to the signal line. Each of the stages ST1 to STn may be connected to a gate line arranged in a corresponding row of the pixel area 110. Each of the stages ST1 to STn may generate a gate signal GSS as an output signal GS and output the gate signal GSS to the connected gate line GL. That is, each of the stages ST1 to STn may supply a high-level gate signal GSS to the gate line GL arranged in the corresponding row. In an embodiment, each of the stages ST1 to STn of the gate driving circuit 130 may be the stage STka illustrated in FIG. 5, the stage STkb illustrated in FIG. 11A, the stage STkb1 illustrated in FIG. 11B, the stage STkb2 illustrated in FIG. 11C, the stage STkb3 illustrated in FIG. 11D, the stage STkc illustrated in FIG. 12, the stage STkd illustrated in FIG. 13, or the stage STke illustrated in FIG. 14.

The number of stages constituting the gate driving circuit 130 according to an embodiment may vary depending on the number of rows (horizontal lines) arranged in the pixel area 110.

The data driving circuit 150 may be connected to a plurality of data lines DL and may supply a data signal DATA to the data lines DL in response to a data driving control signal DCS from the controller 190. The data signal DATA supplied to the data lines DL may be supplied to the pixel PX to which the gate signal GSS is supplied. The data driving circuit 150 may convert input image data with gradation input from the controller 190, into a data signal DATA in the form of a voltage or current.

The power supply circuit 170 may generate signals (voltage and current) necessary for driving the pixels PX of the pixel area 110, in response to a power driving control signal PCS from the controller 190. When the display apparatus 10 is an organic light emitting display apparatus, the power supply circuit 170 may generate a first power voltage ELVDD and a second power voltage ELVSS and supply the same to the pixels PX. The first power voltage ELVDD may be a high-level voltage provided to one terminal of a driving transistor connected to a first electrode (pixel electrode or anode) of an organic light emitting diode included in the pixel PX. The second power voltage ELVSS may be a low-level voltage provided to a second electrode (opposite electrode or cathode) of the organic light emitting diode. The first power voltage ELVDD and the second power voltage ELVSS may be driving voltages for emitting light of the plurality of pixels PX.

The power supply circuit 170 may generate a first voltage VGH, a second voltage VGL, and a fifth voltage VGL2 described above with reference to FIGS. 5 and 14 and may supply the same to the gate driving circuit 130. The power supply circuit 170 may generate a reset signal ESR (see FIG. 3), a plurality of clock signals CLK1 and CLK2 (see FIG. 3), and an external signal FLM (see FIG. 3) and supply the same to the gate driving circuit 130.

The controller 190 may generate a gate driving control signal GCS, a data driving control signal DCS, and a power driving control signal PCS based on the signals input from the outside. The controller 190 may supply the gate driving control signal GCS to the gate drive circuit 130, supply the data driving control signal DCS to the data drive circuit 150, and supply the power driving control signal PCS to the power supply circuit 170.

Although the display apparatus 10 of FIG. 15 independently includes the power supply circuit 170 and the controller 190, the invention is not limited thereto. In an embodiment, the power supply circuit 170 may be included in the controller 190.

In an embodiment, the display apparatus 10 may include a display panel, and the display panel may include a substrate, where pixels PX may be arranged in a display area of the substrate. A portion or all of the gate driving circuit 130 may be directly formed in a peripheral area of the substrate in the process of forming transistors constituting a pixel circuit in the display area of the substrate. Each of the data driving circuit 150, the power supply circuit 170, and the controller 190 may be formed in the form of a separate integrated circuit chip or as a single integrated circuit chip and disposed over a flexible printed circuit board (FPCB) electrically connected to a pad arranged on one side of the substrate. In other embodiments, the data driving circuit 150, the power supply circuit 170, and the controller 190 may be directly disposed over the substrate by using a chip-on-glass (COG) or chip-on-plastic (COP) method.

According to an embodiment, a driving circuit may use an NMOS charge pump (e.g., a second transistor T2, a fourth transistor T4, and a first capacitor C1) and a PMOS charge pump (e.g., a third transistor T3, a fifth transistor T5, and a second capacitor C2), and may adjust a backgate voltage of some NMOS transistors to secure a driving margin, reduce power consumption, and increase operational stability. According to an embodiment, it may be possible to provide a gate driving circuit capable of stably outputting a gate signal and reducing power consumption by reducing the number of signals supplied to a stage, and a display apparatus including the gate driving circuit.

The effects of the invention are not limited to the above effects and may be variously extended without departing from the spirit and scope of the invention.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the invention. Moreover, the embodiments or parts of the embodiments may be combined in whole or in part without departing from the scope of the invention.

What is claimed is:

1. A driving circuit comprising a plurality of stages, wherein each of the plurality of stages comprises:
a first transistor connected between a first node and a first terminal through which a start signal is input and comprising a gate connected to a clock terminal through which a clock signal is input;
a second transistor connected between the first node and a second node and comprising a first gate connected to a second terminal through which a first voltage is supplied and a second gate connected to a third terminal through which a second voltage is supplied;
a third transistor connected between the first node and a third node and comprising a gate connected to the third terminal;
a fourth transistor connected between the second terminal and an output terminal and comprising a first gate connected to the second node and a second gate connected to the third node;
a fifth transistor connected between the third terminal and the output terminal and comprising a gate connected to the third node;
a first capacitor connected between the second node and the output terminal; and
a second capacitor connected between the third node and the output terminal,
wherein the first voltage is a high-level voltage and the second voltage is a low-level voltage.

2. The driving circuit of claim 1, further comprising:
a sixth transistor connected between the first node and the third terminal and comprising a gate connected to a fourth terminal which is configured to supply a reset signal; and
a third capacitor connected between the first node and the second terminal.

3. The driving circuit of claim 1, wherein the first transistor, the third transistor, and the fifth transistor are P-type transistors, and wherein the second transistor and the fourth transistor are N-type transistors.

4. The driving circuit of claim 2, wherein the start signal comprises an external signal or an output signal which is output by a previous stage.

5. The driving circuit of claim 2, further comprising a seventh transistor connected between the output terminal and the fifth transistor and which comprises a gate connected to the third node.

6. The driving circuit of claim 1, wherein the clock signal alternates between a first voltage level and a second voltage level, and
wherein the first voltage level is a high-level voltage level and the second voltage level is a low-level voltage level.

7. The driving circuit of claim 6, wherein a clock signal input to a clock terminal of even-numbered stages among the plurality of stages is shifted by a half period from a clock signal input to a clock terminal of odd-numbered stages.

8. The driving circuit of claim 7, wherein, in a first section in which the start signal of the first voltage level is input and in which the clock signal of the second voltage level is input,
a voltage of the first node and the third node is at the first voltage level and a voltage of the second node is at a third voltage level, wherein the third voltage level is higher than the first voltage level, and
an output signal of the first voltage level is output from the output terminal by the fourth transistor when the fourth transistor is turned-on.

9. The driving circuit of claim 8, wherein, in a second section which follows the first section and in which the start signal of the first voltage level is input and in which the clock signal of the first voltage level is input,
a voltage of the first node and the third node is at the first voltage level and a voltage of the second node is at the third voltage level, and
an output signal of the first voltage level is output from the output terminal by the fourth transistor when the fourth transistor is turned-on.

10. The driving circuit of claim 9, wherein, in a third section which follows the second section and in which the start signal of the second voltage level is input and in which the clock signal of the first voltage level is input,
a voltage of the first node and the second node is at the first voltage level and a voltage of the third node is at the third voltage level, and
an output signal of the first voltage level is output from the output terminal by the fourth transistor when the fourth transistor is turned-on.

11. The driving circuit of claim 10, wherein, in a fourth section which follows the third section and in which the start signal of the second voltage level is input and in which the clock signal of the second voltage level is input,
a voltage of the first node and the second node is at the second voltage level and a voltage of the third node is at a fourth voltage level, wherein the fourth voltage level is lower than the second voltage level, and
an output signal of the second voltage level is output from the output terminal by the fifth transistor when the fifth transistor is turned-on.

12. The driving circuit of claim 11, wherein, in a fifth section which follows the fourth section and in which the start signal of the second voltage level is input and in which the clock signal of the first voltage level is input,
a voltage of the first node and the second node is at the second voltage level and a voltage of the third node is at the fourth voltage level, and
an output signal of the second voltage level is output from the output terminal by the fifth transistor when the fifth transistor is turned-on.

13. The driving circuit of claim 1, further comprising a sixth transistor connected between the second node and the third terminal and comprising a gate connected to the third node.

14. A driving circuit comprising a plurality of stages, wherein each of the plurality of stages comprises:
a first transistor connected between a first node and a first terminal through which a start signal is input and which comprises a gate connected to a clock terminal through which a clock signal is input;
a second transistor connected between the first node and a second node and which comprises a first gate connected to a second terminal through which a first voltage is supplied and a second gate connected to a third terminal through which a second voltage is supplied;
a third transistor connected between the first node and a third node and comprising a gate connected to a fourth terminal through which a third voltage is supplied;

23 a fourth transistor connected between the second terminal and an output terminal and which comprises a first gate connected to the second node and a second gate connected to a fifth terminal through which a fourth voltage is supplied;

a fifth transistor connected between the fourth terminal and the output terminal and comprising a gate connected to the third node;

a first capacitor connected between the second node and the output terminal; and a second capacitor connected between the third node and the output terminal, wherein the first voltage is a high-level voltage and the third voltage is a low-level voltage.

15. The driving circuit of claim 14, further comprising:

a sixth transistor connected between the first node and the fourth terminal and comprising a gate connected to a sixth terminal which is configured to supply a reset signal; and a third capacitor connected between the first node and the second terminal.

16. The driving circuit of claim 14, further comprising:

a seventh transistor connected between the third transistor and the third node and comprising a gate connected to the fourth terminal; and an eighth transistor connected between a fourth node between the third transistor and the seventh transistor and a seventh terminal through which a fifth voltage is supplied and which comprises a gate connected to the third node, wherein the fifth voltage is lower than the third voltage.

17. The driving circuit of claim 16, wherein the first transistor, the third transistor, the fifth transistor, the seventh transistor, and the eighth transistor are P-type transistors, and wherein the second transistor and the fourth transistor are N-type transistors.

18. The driving circuit of claim 14, wherein the second voltage is equal to the first voltage.

19. The driving circuit of claim 14, wherein the third terminal is connected to the first node.

20. The driving circuit of claim 14, wherein the fourth voltage is a negative constant voltage having a greater absolute value than the third voltage.

* * * * *